(12) United States Patent
Koyama

(10) Patent No.: US 7,737,924 B2
(45) Date of Patent: Jun. 15, 2010

(54) DISPLAY DEVICE AND ELECTRIC EQUIPMENT USING THE SAME

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 744 days.

(21) Appl. No.: 10/313,778

(22) Filed: Dec. 5, 2002

(65) Prior Publication Data

US 2003/0117388 A1   Jun. 26, 2003

(30) Foreign Application Priority Data

Dec. 7, 2001   (JP) .............................. 2001-374938

(51) Int. Cl.
G09G 3/32   (2006.01)
(52) U.S. Cl. ........................ 345/82; 345/83; 345/205; 345/206; 345/211; 345/212; 345/213
(58) Field of Classification Search ................... 345/46, 345/76, 82–83, 205–206, 211–213
See application file for complete search history.

(56) References Cited

U.S. PATENT DOCUMENTS

| | | | |
|---|---|---|---|
| 5,019,727 A * | 5/1991 | Kusaba ........................ 326/108 |
| 5,291,149 A * | 3/1994 | Nunoshima ................. 330/255 |
| 5,808,458 A | 9/1998 | Fujisawa et al. |
| 5,808,506 A * | 9/1998 | Tran ............................ 327/537 |
| 5,903,246 A * | 5/1999 | Dingwall ...................... 345/82 |
| 6,057,647 A * | 5/2000 | Kurosawa et al. ......... 315/169.3 |
| 6,150,800 A | 11/2000 | Kinoshita et al. |
| 6,204,610 B1 | 3/2001 | Komaya |
| 6,289,295 B1 * | 9/2001 | Hill ................................ 703/1 |
| 6,469,405 B1 * | 10/2002 | Moya et al. .................. 307/130 |
| 6,472,804 B2 * | 10/2002 | Mueller et al. ............... 313/326 |
| 6,476,669 B2 * | 11/2002 | McClure et al. ............. 327/543 |
| 6,518,962 B2 | 2/2003 | Kimura et al. |
| 6,538,390 B2 | 3/2003 | Fujita et al. |
| 6,661,029 B1 * | 12/2003 | Duggal ......................... 257/89 |

(Continued)

FOREIGN PATENT DOCUMENTS

EP   0 923 067   6/1999

(Continued)

OTHER PUBLICATIONS

Tsutsui, T. et al. "Electroluminescence in organic thin films." Photochemical Processes in Organized Molecular Systems, Elsevier Science Publishers, 1991, p. 437.

(Continued)

Primary Examiner—Richard Hjerpe
Assistant Examiner—Leonid Shapiro
(74) Attorney, Agent, or Firm—Fish & Richardson P.C.

(57) ABSTRACT

A power source for EL driving is built in an active matrix type EL display device, and the number of power sources externally attached is reduced. Therefore, the power source for EL driving is constructed by a transistor formed on a substrate, and its output circuit is constructed by a p-channel transistor of a source ground when the anode of an OLED is operated. Thus, the electric potential difference between a power voltage and an output voltage is reduced, and a power source circuit of small electric power consumption is constructed.

52 Claims, 14 Drawing Sheets

U.S. PATENT DOCUMENTS

| | | | |
|---|---|---|---|
| 6,747,617 B1 * | 6/2004 | Kawashima | 345/76 |
| 6,791,539 B2 * | 9/2004 | Nakajima et al. | 345/204 |
| 6,798,405 B2 * | 9/2004 | Anzai | 345/205 |
| 6,887,162 B2 * | 5/2005 | Lindsay | 473/151 |
| 6,919,886 B2 | 7/2005 | Sato et al. | |
| 6,995,758 B2 * | 2/2006 | Fukuda | 345/205 |
| 7,019,717 B2 | 3/2006 | Yumoto et al. | |
| 2002/0047822 A1 | 4/2002 | Senda et al. | |
| 2002/0171611 A1 | 11/2002 | Cok | |
| 2002/0180721 A1 | 12/2002 | Kimura et al. | |
| 2002/0196208 A1 * | 12/2002 | Nanno et al. | 345/55 |
| 2003/0063081 A1 | 4/2003 | Kimura et al. | |
| 2003/0107560 A1 | 6/2003 | Yumoto et al. | |
| 2005/0248514 A1 | 11/2005 | Sato et al. | |
| 2006/0170624 A1 | 8/2006 | Yumoto et al. | |

FOREIGN PATENT DOCUMENTS

| | | |
|---|---|---|
| EP | 0 987 615 | 3/2000 |
| EP | 1 103 946 | 5/2001 |
| EP | 1 176 581 | 1/2002 |
| EP | 1 260 959 | 11/2002 |
| EP | 1 353 316 | 10/2003 |
| JP | 03-155090 * | 3/1991 |
| JP | 03-155090 | 7/1991 |
| JP | 10-161758 | 6/1998 |
| JP | 2000-089840 | 3/2000 |
| JP | 2001-056669 | 2/2001 |
| JP | 2001-343933 | 12/2001 |
| JP | 2002-251160 | 9/2002 |
| JP | 2002-333870 | 11/2002 |
| JP | 2003-015606 | 1/2003 |
| KR | 2002-0020194 | 3/2002 |
| KR | 2002-0068939 | 8/2002 |
| KR | 2002-0077137 | 10/2002 |
| KR | 2002-0080002 | 10/2002 |
| WO | WO98-40871 | 9/1998 |
| WO | 01-57839 | 8/2001 |
| WO | WO02-35507 | 5/2002 |

OTHER PUBLICATIONS

Baldo, M.A. et al. "Highly efficient phosphorescent emission from organic electroluminescent devices." Nature 395, Sep. 10, 1998, p. 151.

Baldo, M.A. et al. "Very high-efficiency green organic light-emitting devices based on electrophosphorescence." Applied Physics Letters 75(1), Jul. 5, 1999, p. 4.

Tsutsui, T. et al. "High quantum efficiency in organic light-emitting devices with iridium-complex as a triplet emissive center." Jpn. J. Appl. Phys. 38, Dec. 15, 1999, p. 1502.

Tsutsui, T. et al. "Electroluminescence in organic thin films." Photochemical Processes in Organized Molecular Systems, Elsevier Science Publishers, 1991, pp. 437-450.

Baldo, M.A. et al. "Highly efficient phosphorescent emission from organic electroluminescent devices." Nature 395, Sep. 10, 1998, pp. 151-154.

Baldo, M.A. et al. "Very high-efficiency green organic light-emitting devices based on electrophosphorescence." Applied Physics Letters 75(1), Jul. 5, 1999, pp. 4-6.

Tsutsui, T. et al. "High quantum efficiency in organic light-emitting devices with iridium-complex as a triplet emissive center." Jpn. J. Appl. Phys. 38, Dec. 15, 1999, pp. 1502-1504.

Office Action (Application No. 02154282.1 CN6124 Dated Feb. 2, 2007).

Second Office Action (Chinese Application No. 02154282.1) mailed Aug. 10, 2007 with English language translation, 38 pages.

Korean Office Action received in Korean Application No. 01-2002-0077281 dated Jan. 31, 2009 with English Translation.

* cited by examiner

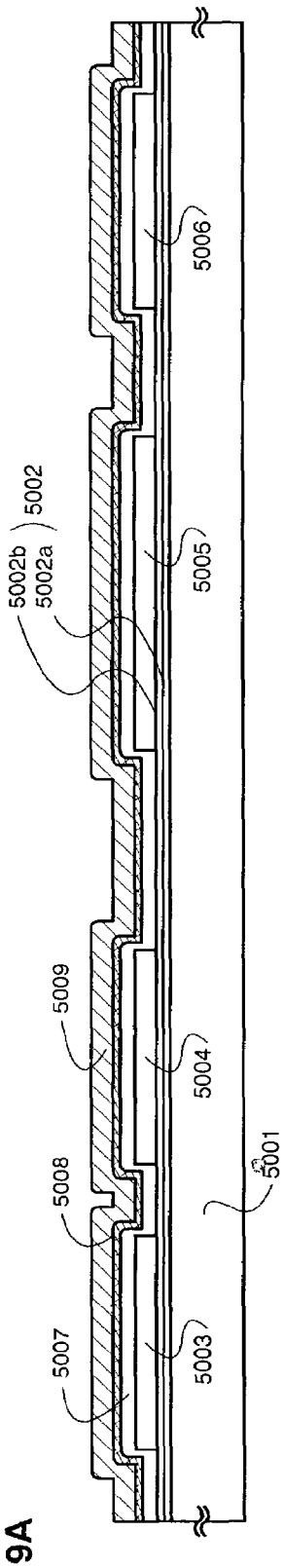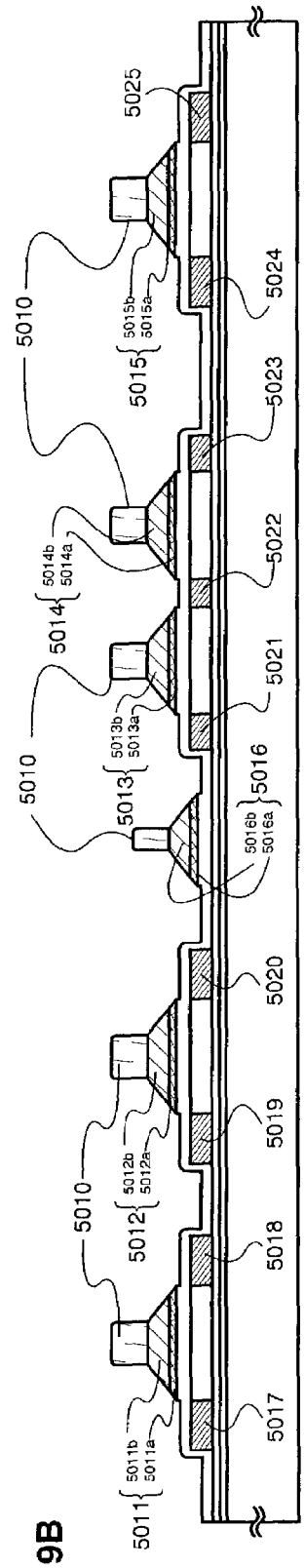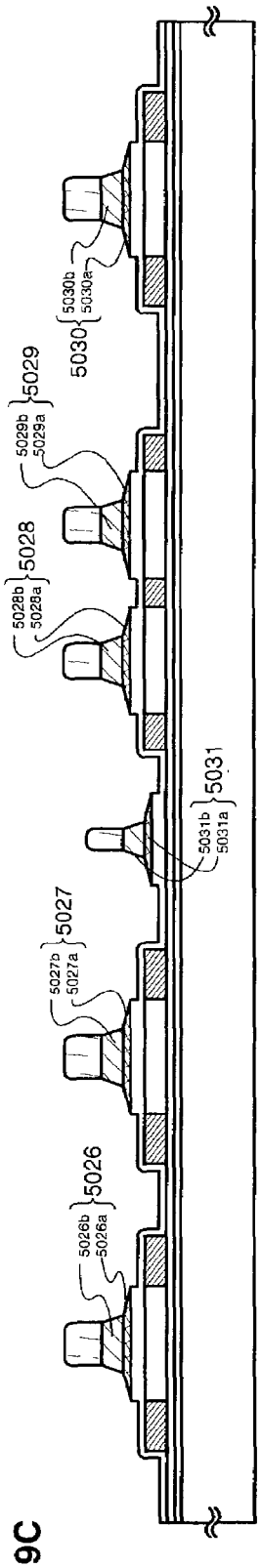
Fig. 9A
Fig. 9B
Fig. 9C

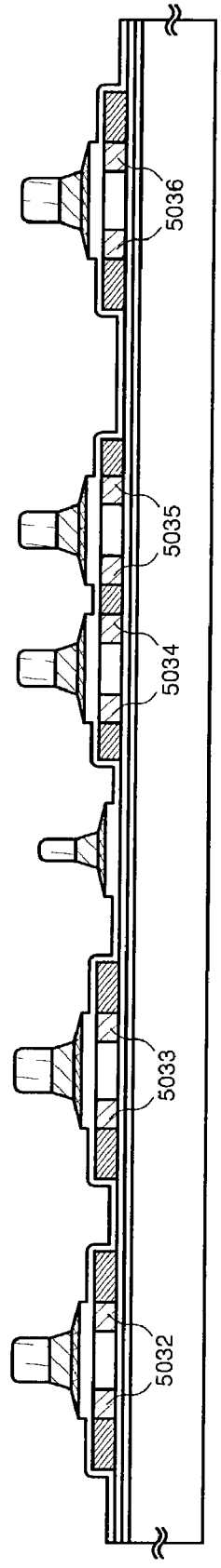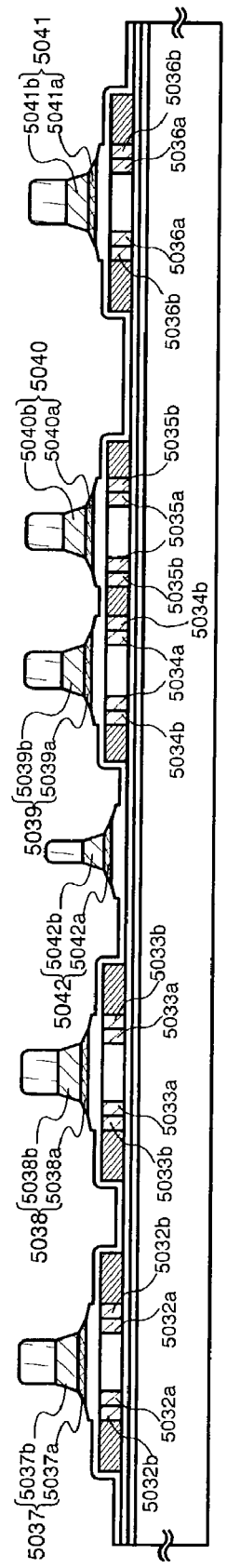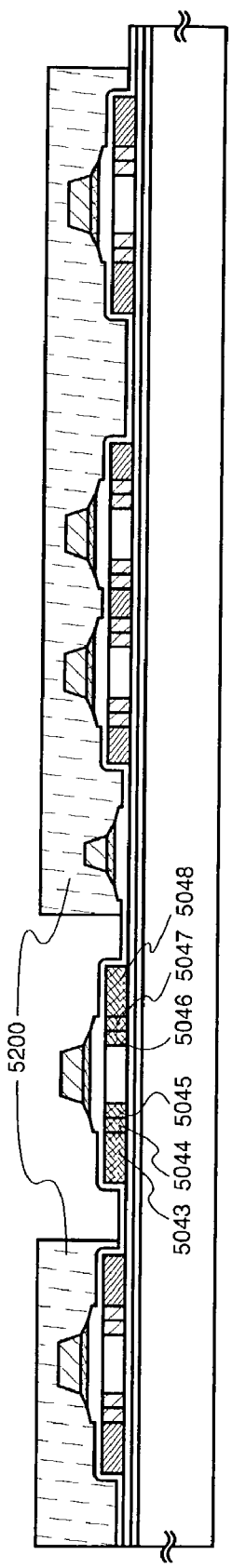

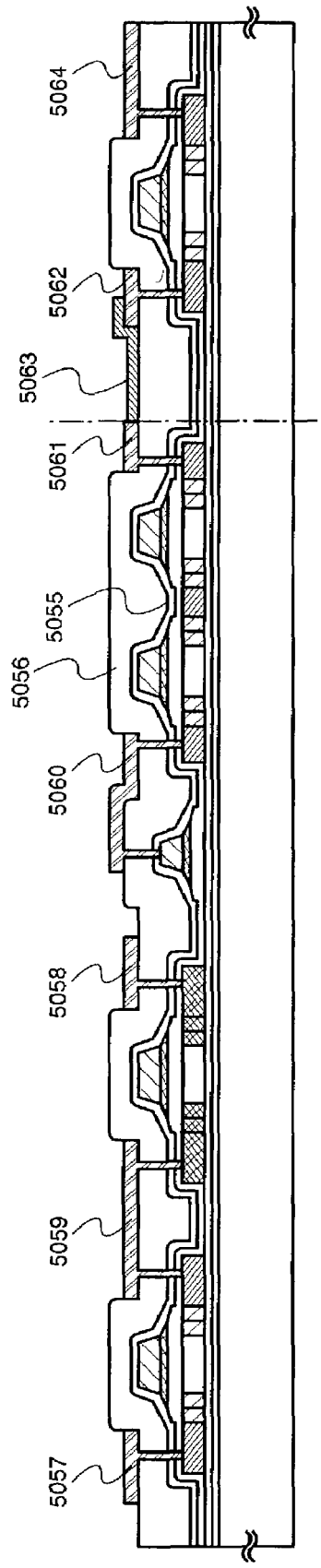
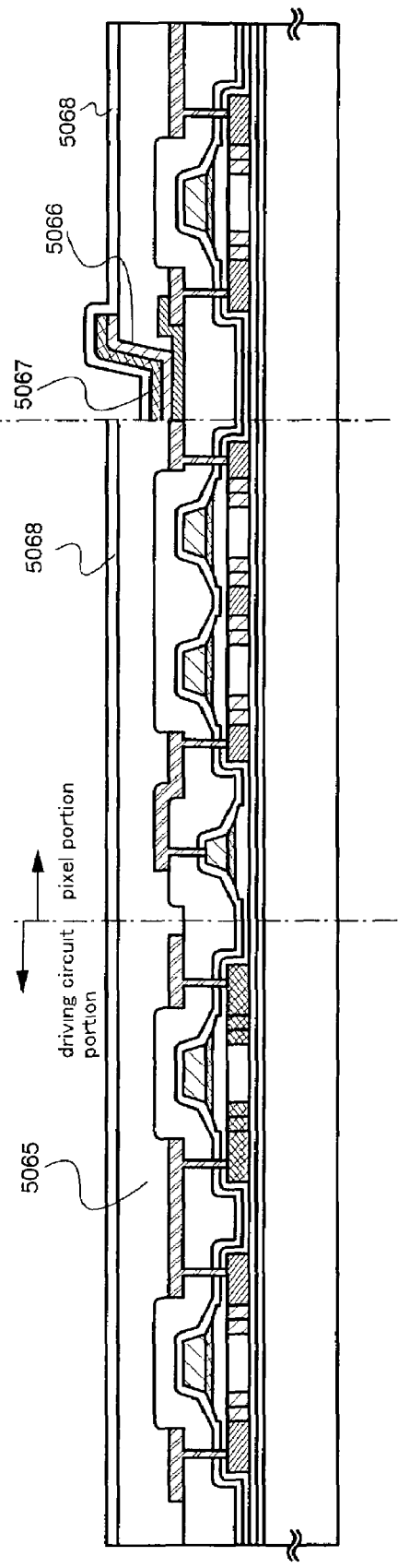
Fig. 11A
Fig. 11B

DISPLAY DEVICE AND ELECTRIC EQUIPMENT USING THE SAME

BACKGROUND OF THE INVENTION

1. Field of the Invention

The present invention relates to a display device, particularly, to an OLED display device using a thin film transistor formed on the transparent substrate such as glass or plastic. Further, it relates to an electronic device using the display device.

2. Description of the Related Art

In resent years, a cellular phone has been becoming popular by developing communication technology. In future, electrical transmission of moving pictures and transmission of a large quantity of information will be expected. With being lightened, a mobile personal computer is into production. An information device called a personal digital assistant (PDA) developed from electrical books is produced and becoming popular. With developing a display device and the like, most of such portable information devices are equipped with flat displays.

The latest technology aims at using an active matrix type display device as a display device used in the portable information devices.

In the active matrix type display device, TFTs (thin film transistors) are provided in correspondence with respective pixels to control pictures. The active matrix type display device has an advantages that the high definition of images is possible, the improvement of image quality is possible, the correspondence to moving image is possible, and the like, compared to a passive matrix type display device. Therefore, the display device of the portable information devices will be changed from a passive matrix type to an active matrix type.

Above all, a display device using low-temperature polysilicon has been production in recent years. In the low-temperature polysilicon technology, the driver circuit using TFTs can be formed simultaneously in the periphery of a pixel portion in addition to a pixel TFT that constitutes a pixel. Thereby, the low-temperature polysilicon technology can contribute to miniaturization of devices and low power consumption. Accordingly, the low-temperature polysilicon device become indispensable to the display device of the mobile device which has been widely applied to various fields in recent years.

In recent years, the development of a display device using an organic electroluminescence elements (OLED elements) has been becoming more and more active. Hereinafter, the OLED element includes both the OLED element using luminescence from singlet exciton (fluorescence) and the OLED element using luminescence from triplet exciton (phosphorescence) here. In this specification, the OLED element is described as an example of a light emitting element, however, another light emitting elements can be used.

The OLED element has a structure in which an OLED layer is interposed between a pair of electrodes (an anode and a cathode), and usually has a laminated structure. Representatively, there is a laminated structure which is expressed in "hole transporting layer/light emitting layer/electron transporting layer", proposed by Tang et al. of Eastman Kodak Company.

Other structures may also be adopted, such as a structure in which "a hole injecting layer/a hole transporting layer/a light emitting layer/an electron transporting layer" are stacked in order, or a structure in which "a hole injecting layer/a hole transporting layer/a light emitting layer/an electron transporting layer/an electron injecting layer" are laminated in order.

In the present invention, each structure may be employed. The light emitting layer may also be doped with a fluorescent pigment or the like.

In this specification, all layers provided between a cathode and an anode are herein generically called "OLED layer". Accordingly, all the aforementioned hole injecting layer, hole transporting layer, light emitting layer, electron transporting layer and electron injecting layer are encompassed in the OLED layer. A light emitting element constituted of an anode, an OLED layer, and a cathode is called "OLED element".

FIG. 3 shows an example of the construction of a pixel portion of an active matrix type OLED display device. Gate signal lines (G1 to Gy) to which selection signals are to be inputted from a gate signal line driver circuit is connected to a gate electrode of a switching TFT 301 which is provided in each pixel of the pixel portion. Either one of source and drain regions of the switching TFT 301 provided in each pixel is connected to source signal lines (S1 to Sx) to which signals are to be inputted from a source signal line driver circuit, while the other is connected to a gate electrode of an OLED driving TFT 302 and to either one of electrodes of a capacitor 303 which is provided in each pixel. The other electrode of the capacitor 303 is connected to power supply lines (V1 to Vx). Either one of source and drain regions of the OLED driving TFT 302 provided in each pixel is connected to the power supply lines (V1 to Vx), while the other is connected to one of electrodes of the OLED element 304 provided in each pixel.

The OLED element 304 has an anode, a cathode and an OLED layer provided between the anode and the cathode. If the anode of the OLED element 304 is connected to the source region or the drain region of the OLED driving TFT 302, the anode and the cathode of the OLED element 304 become a pixel electrode and a counter electrode, respectively. Contrarily, if the cathode of the OLED element 304 is connected to the source region or the drain region of the OLED driving TFT 302, the cathode and the anode of the OLED element 304 become a pixel electrode and a counter electrode, respectively.

Incidentally, the potential of the counter electrode is herein called "counter potential", and a power source for applying the counter potential to the counter electrode is herein called "counter power source". The difference between the potential of the pixel electrode and the potential of the counter electrode is an OLED driving voltage, and the OLED driving voltage is applied to the OLED layer.

As a gray scale display method for the above-described OLED display device, there are an analog gray scale method and a time gray scale method.

First, the analog gray scale method for the OLED display device will be described below. FIG. 4 is a timing chart showing the case driving the display device shown in FIG. 3 by the analog gray scale method. The period that starts when one gate signal is selected and finishes when the next gate signal line is selected is herein called "one line period (L)". The period that starts when one image is selected and finishes when the next image is selected corresponds to one frame period. In the case of the OLED display device shown in FIG. 3, the number of gate signal lines is "y", and y-number of line periods (L1 to Ly) are provided in one frame period.

As resolution of the OLED display device becomes higher, the number of line periods for one frame period becomes larger, and the driver circuit of the OLED display device must be driven at a higher frequency.

The power supply lines (V1 to Vx) are kept at a constant voltage (power source potential). In addition, the counter potential is kept constant. The counter potential has a potential difference from the power source potential so that the OLED elements emit light.

In the first line period (L1), a selection signal from the gate signal line driver circuit is inputted to the gate signal line G1. Then, analog video signals are inputted to the source signal lines (S1 to Sx) in order.

Since all the switching TFTs 301 connected to the gate signal line G1 are turned on, the analog video signals inputted to the source signal lines (S1 to Sx) are respectively inputted to the gate electrodes of the OLED driving TFTs 302 via the switching TFTs 301.

According to the potential of the analog video signal inputted into the pixel when the switching TFT 301 is turned on, the gate voltage of the OLED driving TFT 302 varies. At this time, the drain current of the OLED driving TFT 302 is determined at a 1-to-1 correspondence in accordance with the gate voltage and the Id-Vg characteristic of the OLED driving TFT 302. Specifically, according to the potential of the analog video signal inputted to the gate electrode of the OLED driving TFT 302, the potential of the drain region of the OLED driving TFT 302 (an OLED driving voltage in on state) is determined, a predetermined drain current flows into the OLED element, and the OLED element emits light at the amount of emission which is corresponding to the amount of the drain current.

When the above-described operation is repeated until the termination of inputting the analog video signals to the respective source signal lines (S1 to Sx), the first line period (L1) terminates. Incidentally, one line period may also be defined as the sum of the period required until the termination of inputting the analog video signals to the respective source signal lines (S1 to Sx) and a horizontal retrace period. Then, the second line period (L2) starts, and a selection signal is inputted to the gate signal line G2. Similarly to the first line period (L1), analog video signals are inputted to the source signal lines (S1 to Sx) in order.

When selection signals are inputted to all the gate signal lines (G1 to Gy), all the line periods (L1 to Ly) terminate. When all the line periods (L1 to Ly) terminate, one frame period terminates. During one frame period, all the pixels perform displaying and one image is formed. Incidentally, one frame period may also be defined as the sum of all the line periods (L1 to Ly) and a vertical retrace period.

As described above, the amount of emission of the OLED element is controlled by the analog video signal, and gray scale display is provided by controlling the amount of emission. In the analog gray scale method, gray scale display is carried out by the variation in the potentials of the respective analog video signals inputted to the source signal lines.

The time gray scale method will be described below.

In the time gray scale method, digital signals are inputted to pixels to select a emitting state or a non-emitting state of the respective OLED elements, whereby gray scales are represented by accumulating periods per frame period during which each of the OLED elements emits.

In the following description, $2^n$ gray scales (n is a natural number) are represented. FIG. 5 is a timing chart showing the case of driving the display device shown in FIG. 3 by the time gray scale method. One frame period is divided into n-number of sub-frame periods ($SF_1$ to $SF_n$). Incidentally, the period for which all the pixels in the pixel portion display one image is called "one frame period (F)". Plural periods into which one frame period is divided are called "sub-frame periods", respectively. As the number of gray scales increases, the number into which one frame period is divided also increases, and the driver circuit of the OLED display device must be driven at a higher frequency.

One sub-frame period is divided into a write period (Ta) and a display period (Ts). The write period is a period for which digital signals are inputted to all the pixels during one sub-frame period, and the display period (also called "lighting period") is a period for which the respective OLED display devices are in an emitting state or a non-emitting state in accordance with the input digital signals, thereby perform displaying.

The OLED driving voltage shown in FIG. 5 represents the OLED driving voltage of an OLED element for which the emitting state is selected. Specifically, the OLED driving voltage (see FIG. 3) of the OLED element for which the emitting state is selected is 0 V during the write period, and has a magnitude which enables the OLED element to emit light, during the display period.

The counter potential is controlled by an external switch (not shown) so that the counter potential is kept at approximately the same level as the power source potential during the write period, and has, during the display period, a potential difference from the power source potential to so that the OLED element emits light.

The write period and the display period of each sub-frame period will first be described in detail with reference to FIGS. 3 and 5, and subsequently, the time gray scale display will be described.

First, a gate signal is inputted to the gate signal line G1, and all the switching TFTs 301 connected to the gate signal line G1 are turned on. Then, digital signals are inputted to the source signal lines (S1 to Sx) in order. The counter potential is kept at the same level as the potential of the power supply lines (V1 to Vx) (power source potential). Each of the digital signals has information of "0" or "1", that is, each of the digital signals of "0" or "1" has a voltage of high level (Hi) or low level (Lo).

Then, the digital signals inputted to the source signal lines (S1 to Sx) are respectively inputted to the gate electrodes of the OLED driving TFTs 302 via the switching TFTs 301 which are in the on state. The respective digital signals are also inputted to the capacitors 303 and stored.

Then, the above-described operation is repeated by inputting gate signals to the respective gate signal lines (G2 to Gy) in order, whereby digital signals are inputted to all the pixels and the input digital signal is held in each of the pixels. The period required until the digital signals are inputted to all the pixels is called "write period".

When the digital signals are inputted to all the pixels, all the switching TFTs 301 are turned off. Thus, the external switch (not shown) connected to the counter electrode causes the counter potential to vary so that a potential difference that enables the OLED element 304 to emit light is produced between the counter potential and the power source potential.

In the case where the digital signals have information of "0", the OLED driving TFTs 302 are turned off and the OLED elements 304 do not emit light. Contrarily, in the case where the digital signals have information of "1", the OLED driving TFTs 302 are turned on. Consequently, the pixel electrodes of the respective OLED elements 304 are kept at approximately the same potential as the power source potential, and the OLED elements 304 emit light. In this manner, the emitting state or the non-emitting state of the OLED elements 304 is selected in accordance with the information of the digital signals, and all the pixels perform displaying at the same time.

When all the pixels perform display, an image is formed. The period for which the pixels perform displaying is called "display period".

The lengths of the write periods ($T_{a1}$ to $T_{an}$) of all the n-number of sub-frame periods ($SF_1$ to $SF_n$) are the same. The display periods (Ts) of the respective sub-frame periods ($SF_1$ to $SF_n$) are denoted by $T_{s1}$ to $T_{sn}$.

The lengths of the respective display periods are set to become $T_{s1}:T_{s2}:T_{s3}:\ldots:T_{s(n-1)}:T_{sn}=2^0:2^{-1}:2^2:\ldots:2^{-(n-2)}:2^{-(n-2)}$, respectively. By combining desired ones of these display periods, it is possible to provide a desired gray scale of $2^n$ gray scales.

The display period is any one of $T_{s1}$ to $T_{sn}$. Here, it is assumed that predetermined pixels are turned on for $T_{s1}$.

Then, when the next write period starts and data signals are inputted to all the pixels, the next display period starts. At this time, the display period is any one of $T_{s2}$ to $T_{sn}$. Here, it is assumed that predetermined pixels are turned on for $T_{s2}$.

The same operation is repeated as to the remaining (n−2)-number of sub-frames, whereby the display periods are set as $T_{s3}, T_{s4}, \ldots, T_{sn}$ in order and predetermined pixels are turned on during each of the sub-frames.

When the n-number of sub-frame periods appear, one frame period terminates. At this time, the gray scale of a pixel is determined by cumulatively calculating the length of the display periods for which the pixel is turned on. For example, assuming that n=8 and the obtainable luminance in the case where the pixel emits light for all the display periods is 100%, a luminance of 75% can be represented if the pixel emits light during $T_{s1}$ and $T_{s2}$ and a luminance of 16% can be realized if $T_{s3}$, $T_{s5}$ and $T_{s8}$ are selected.

Incidentally, in the driving method of the time gray scale method which represents gray scales by inputting n-bit digital signals, the number of plural sub-frame periods into which one frame period is divided, and the lengths of the respective sub-frame periods and the like are not limited to the above-described examples.

There were the following problems in the conventional OLED display device mentioned above.

It is necessary to supply an electric current by a necessary amount to emit light from an OLED element arranged in a pixel section. Here, when an OLED panel of 2 inches is considered and an OLED material in the present situation is used, an electric current of 3.5 mA/cm² in red, an electric current of 1 mA/cm² in green and an electric current of 3 mA/cm² in blue are required to obtain e.g., 200 cd/m² in luminance. Therefore, when these electric currents are converted into two inches, electric currents of 14 mA, 4 mA and 12 mA are respectively required. Further, voltages of 8 V, 5 V and 7 V are generated in the respective colors in the OLED element. As shown in FIG. 2, three power source circuits each using a source follower were conventionally prepared outside the panel to supply these electric currents. Defects such as the enlargement of a mounting area, an increase in the number of parts, etc. were caused in these power source circuits.

Further, when the power source circuits constructed by these source followers are used, a MOS transistor is used in a saturation area in the source followers. Therefore, Vds (the voltage between a drain and a source) is increased, and electric power consumption is increased. For example, when 5 V is required as Vds, Vcc is set in conformity with red having a highest OLED voltage with respect to the Vds of the source follower of the power source circuit of each color. Therefore, voltages of 5 V in red, 8 V in green and 6 V in blue are required. When the electric power consumption of the source follower is calculated by respectively multiplying these voltages by the above electric currents, electric powers of 70 mW, 40 mW and 72 mW in the respective colors are generated so that an electric power of 184 mW in total is required. Such electric powers caused the consumption of a battery in a portable device and a reduction in using time of the portable device. Accordingly, it was desirable to build the power source circuit of small electric power into the panel.

SUMMARY OF THE INVENTION

Therefore, an object of the present invention is to build a power source of low electric power consumption in the display device using the OLED element to reduce the size of a mounting area, the cost of each of parts and the electric power consumption.

Further, the present invention can be also applied to a display device using another light emitting element as well as the display device using the OLED element. For example, the present invention can be used in a display device in which the light emitting element including an inorganic material is applied to a hole injecting layer, a hole transporting layer, an electron injecting layer and an electron transporting layer.

The following means are used in the present invention to solve the above problems.

The present invention provides a display device in which plural pixels, plural source signal lines and plural gate signal lines are arranged in a matrix shape on a substrate, and the pixel has an OLED element, wherein a power source circuit for emitting light by applying an electric current or a voltage to the OLED element is formed on the substrate.

The present invention also provides a display device in which plural pixels, plural source signal lines and plural gate signal lines are arranged in a matrix shape on a substrate, and the pixels have OLED elements for emitting red, green and blue lights, wherein a power source circuit for emitting light by applying an electric current or a voltage to the OLED element of each of the red, green and blue colors is formed on the substrate.

The present invention also provides a display device in which plural pixels, plural source signal lines and plural gate signal lines are arranged in a matrix shape on a substrate, and the pixel has an OLED element, wherein a power source circuit for emitting light by applying an electric current or a voltage to the OLED element is formed on the substrate, and the power source circuit uses an operational amplifier.

The present invention also provides a display device in which plural pixels, plural source signal lines and plural gate signal lines are arranged in a matrix shape on a substrate, and the pixels have OLED elements for emitting red, green and blue lights, wherein a power source circuit for emitting light by applying an electric current or a voltage to the OLED element of each of the red, green and blue colors is formed on the substrate, and the power source circuit uses an operational amplifier.

The present invention also provides a display device in which plural pixels, plural source signal lines and plural gate signal lines are arranged in a matrix shape on a substrate, the pixels have OLED elements for emitting red, green and blue lights, a power source circuit for emitting light by applying an electric current or a voltage to the OLED element of each of the red, green and blue colors is formed on the substrate, and the power source circuit uses an operational amplifier, wherein a cathode is set to be common in the OLED elements, and the output of the power source circuit is constructed by a source ground p-channel type transistor.

The present invention also provides a display device in which plural pixels, plural source signal lines and plural gate signal lines are arranged in a matrix shape on a substrate, the pixels have OLED elements for emitting red, green and blue lights, a power source circuit for emitting light by applying an electric current or a voltage to the OLED element of each of the red, green and blue colors is formed on the substrate, and the power source circuit uses an operational amplifier, wherein an anode is set to be common in the OLED elements, and the output of the power source circuit is constructed by a source ground n-channel type transistor.

The present invention also provides a display device in which plural pixels, plural source signal lines and plural gate signal lines are arranged in a matrix shape on a substrate, the pixels have OLED elements for emitting red, green and blue lights, a power source circuit for emitting light by applying an electric current or a voltage to the OLED element of each of the red, green and blue colors is formed on the substrate, the power source circuit uses an operational amplifier, wherein a cathode is set to be common in the OLED elements, the output of the power source circuit is constructed by a source ground p-channel type transistor, and the power source circuit is set such that the difference between a highest electric potential within the power source circuit and an output electric potential is a threshold value of the p-channel type transistor or less.

The present invention also provides a display device in which plural pixels, plural source signal lines and plural gate signal lines are arranged in a matrix shape on a substrate, the pixels have OLED elements for emitting red, green and blue lights, a power source circuit for emitting light by applying an electric current or a voltage to the OLED element of each of the red, green and blue colors is formed on the substrate, and the power source circuit uses an operational amplifier, wherein a cathode is set to be common in the OLED elements, and the output of the power source circuit is constructed by a source ground n-channel type transistor, and the power source circuit is set such that the difference between a lowest electric potential within the power source circuit and an output electric potential is a threshold value of the n-channel type transistor or less.

The present invention also provides a display device in which plural pixels, plural source signal lines and plural gate signal lines are arranged in a matrix shape on a substrate, and the pixels have OLED elements for emitting red, green and blue lights, wherein a power source circuit for supplying an electric current or a voltage to the OLED elements of two colors among the red, green and blue colors is formed on the substrate.

The present invention also provides an electronic device using any one of the above display devices.

The present invention also provides a display device in which plural pixels, plural source signal lines and plural gate signal lines are arranged in a matrix shape on a substrate, and the pixel has a light emitting element, wherein a power source circuit for emitting light by applying an electric current or a voltage to the light emitting element is formed on the substrate.

The present invention also provides a display device in which plural pixels, plural source signal lines and plural gate signal lines are arranged in a matrix shape on a substrate, and the pixels have light emitting elements for emitting red, green and blue lights, wherein a power source circuit for emitting light by applying an electric current or a voltage to the light emitting element of each of the red, green and blue colors is formed on the substrate.

The present invention also provides a display device in which plural pixels, plural source signal lines and plural gate signal lines are arranged in a matrix shape on a substrate, and the pixel has a light emitting element, wherein a power source circuit for emitting light by applying an electric current or a voltage to the light emitting element is formed on the substrate, and the power source circuit uses an operational amplifier.

The present invention also provides a display device in which plural pixels, plural source signal lines and plural gate signal lines are arranged in a matrix shape on a substrate, and the pixels have light emitting elements for emitting red, green and blue lights, wherein a power source circuit for emitting light by applying an electric current or a voltage to the light emitting element of each of the red, green and blue colors is formed on the substrate, and the power source circuit uses an operational amplifier.

The present invention also provides a display device in which plural pixels, plural source signal lines and plural gate signal lines are arranged in a matrix shape on a substrate, the pixels have light emitting elements for emitting red, green and blue lights, a power source circuit for emitting light by applying an electric current or a voltage to the light emitting element of each of the red, green and blue colors is formed on the substrate, and the power source circuit uses an operational amplifier, wherein a cathode is set to be common in the light emitting elements, and the output of the power source circuit is constructed by a source ground p-channel type transistor.

The present invention also provides a display device in which plural pixels, plural source signal lines and plural gate signal lines are arranged in a matrix shape on a substrate, the pixels have light emitting elements for emitting red, green and blue lights, a power source circuit for emitting light by applying an electric current or a voltage to the light emitting element of each of the red, green and blue colors is formed on the substrate, and the power source circuit uses an operational amplifier, wherein an anode is set to be common in the light emitting elements, and the output of the power source circuit is constructed by a source ground n-channel type transistor.

The present invention also provides a display device in which plural pixels, plural source signal lines and plural gate signal lines are arranged in a matrix shape on a substrate, the pixels have light emitting elements for emitting red, green and blue lights, a power source circuit for emitting light by applying an electric current or a voltage to the light emitting element of each of the red, green and blue colors is formed on the substrate, the power source circuit uses an operational amplifier, a cathode is set to be common in the light emitting elements, and the output of the power source circuit is constructed by a source ground p-channel type transistor, wherein the power source circuit is set such that the difference between a highest electric potential within the power source circuit and an output electric potential is a threshold value of the p-channel type transistor or less.

The present invention also provides a display device in which plural pixels, plural source signal lines and plural gate signal lines are arranged in a matrix shape on a substrate, the pixels have light emitting elements for emitting red, green and blue lights, a power source circuit for emitting light by applying an electric current or a voltage to the light emitting element of each of the red, green and blue colors is formed on the substrate, the power source circuit uses an operational amplifier, a cathode is set to be common in the light emitting elements, and the output of the power source circuit is constructed by a source ground n-channel type transistor, wherein the power source circuit is set such that the difference between a lowest electric potential within the power source circuit and an output electric potential is a threshold value of the n-channel type transistor or less.

The present invention also provides a display device in which plural pixels, plural source signal lines and plural gate signal lines are arranged in a matrix shape on a substrate, and the pixels have light emitting elements for emitting red, green and blue lights, wherein a power source circuit for supplying an electric current or a voltage to the light emitting elements of two colors among the red, green and blue colors is formed on the substrate.

The present invention also provides an electronic device using any one of the above display devices.

In the conventional display device, the electric current or the voltage applied to the OLED element within the pixel was supplied by the external power source circuit. Therefore, an increase in externally attached parts, an increase in substrate size, etc. were caused so that manufacturing cost was increased. In the present invention, the number of parts and the substrate size can be reduced by building the power source circuit within the panel.

The present invention can be also applied to a display device using another light emitting element as well as the display device using the OLED element.

BRIEF DESCRIPTION OF THE DRAWINGS

FIGS. 9A, 9B and 9C are views showing a manufacturing process of the display device of the present invention;

FIGS. 10A, 10B and 10C are views showing a manufacturing process of the display device of the present invention;

FIGS. 11A and 11B are views showing a manufacturing process of the display device of the present invention;

DESCRIPTION OF THE PREFERRED EMBODIMENTS

An OLED display device of the present invention will first be explained.

Figure 1:
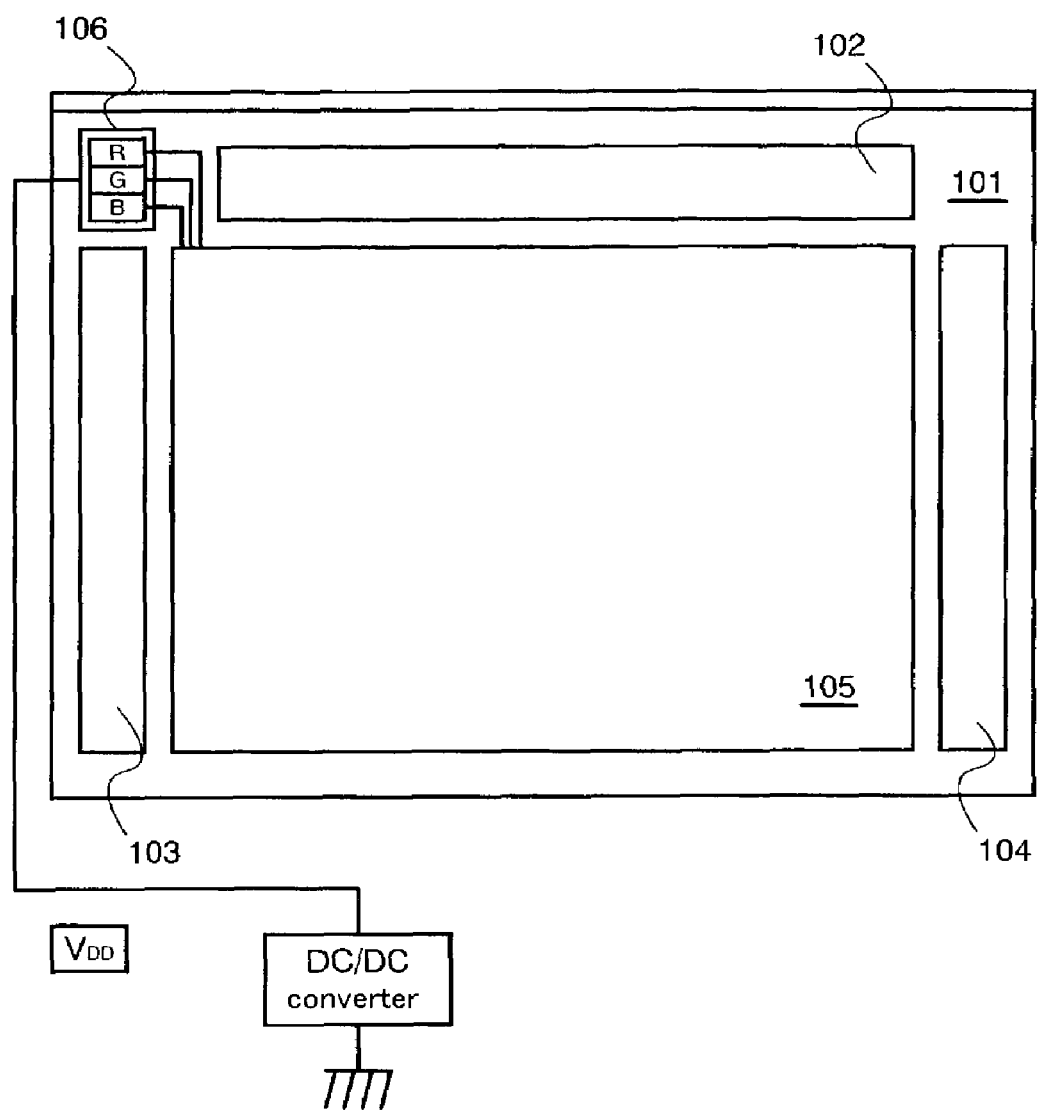
FIG. 1 is a block diagram showing a construction of a display device of the present invention.
Figure 2:
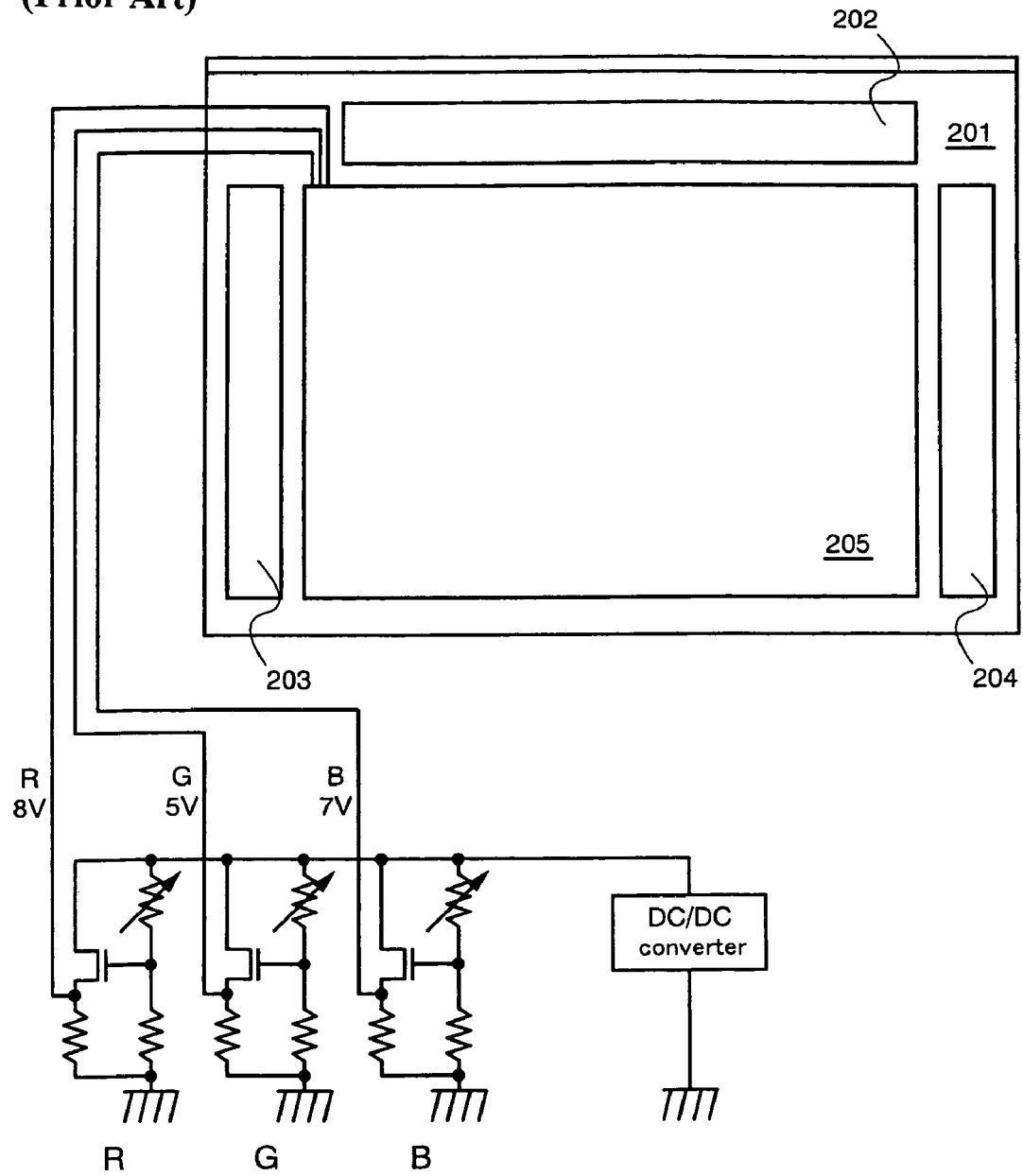
FIG. 2 is a block diagram showing a construction of a conventional display device.
Figure 3:
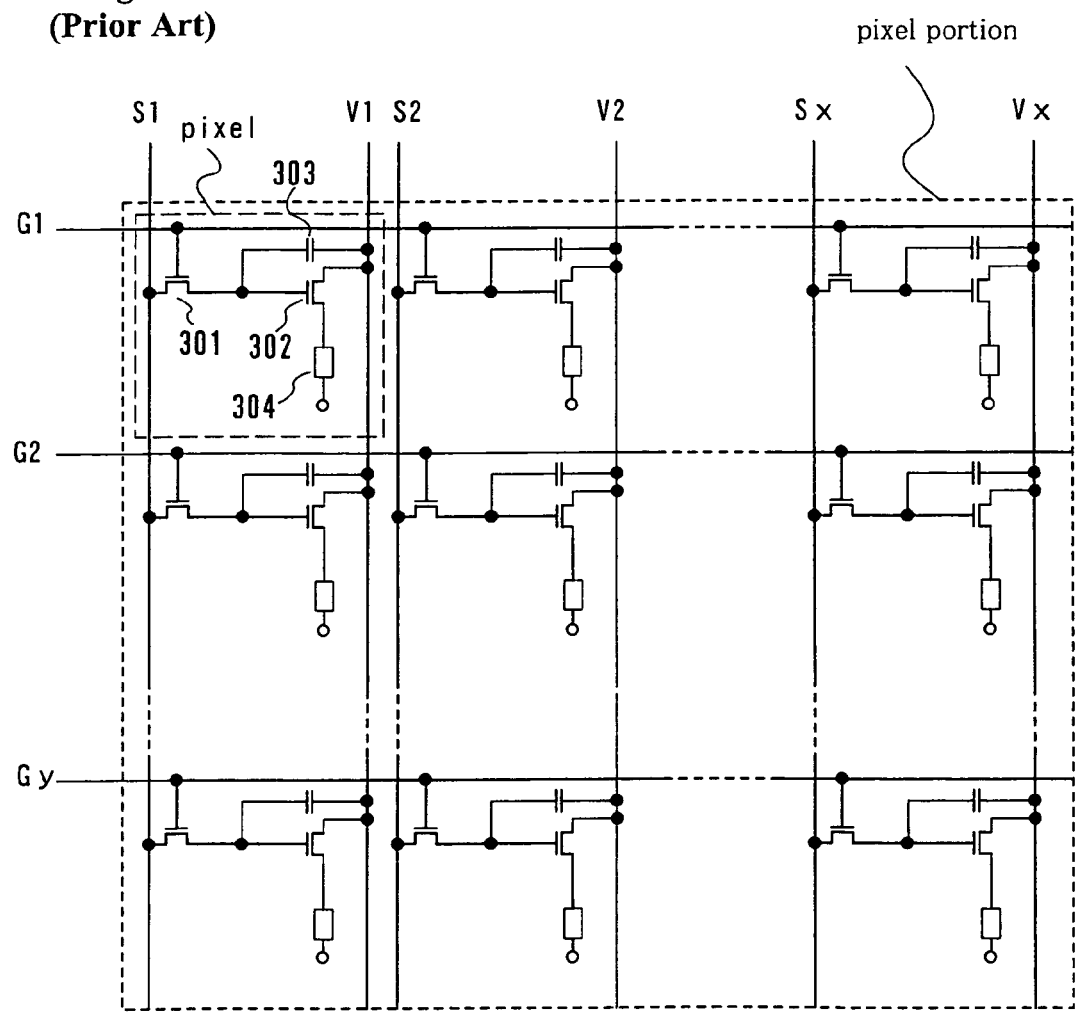
FIG. 3 is a view showing a circuit construction of a pixel of the conventional display device.
Figure 4:
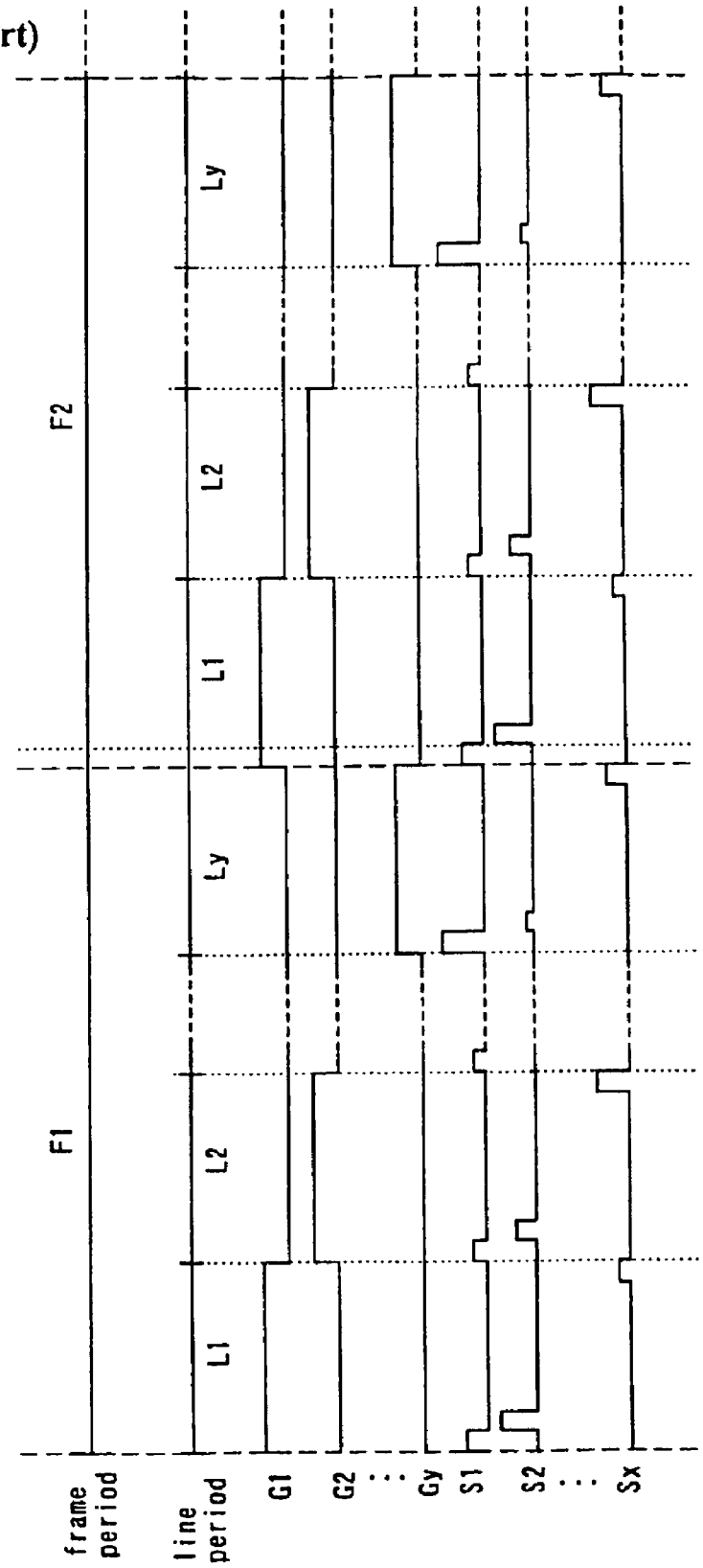
FIG. 4 is a timing chart showing a driving method of the pixel of the conventional display device.
Figure 5:
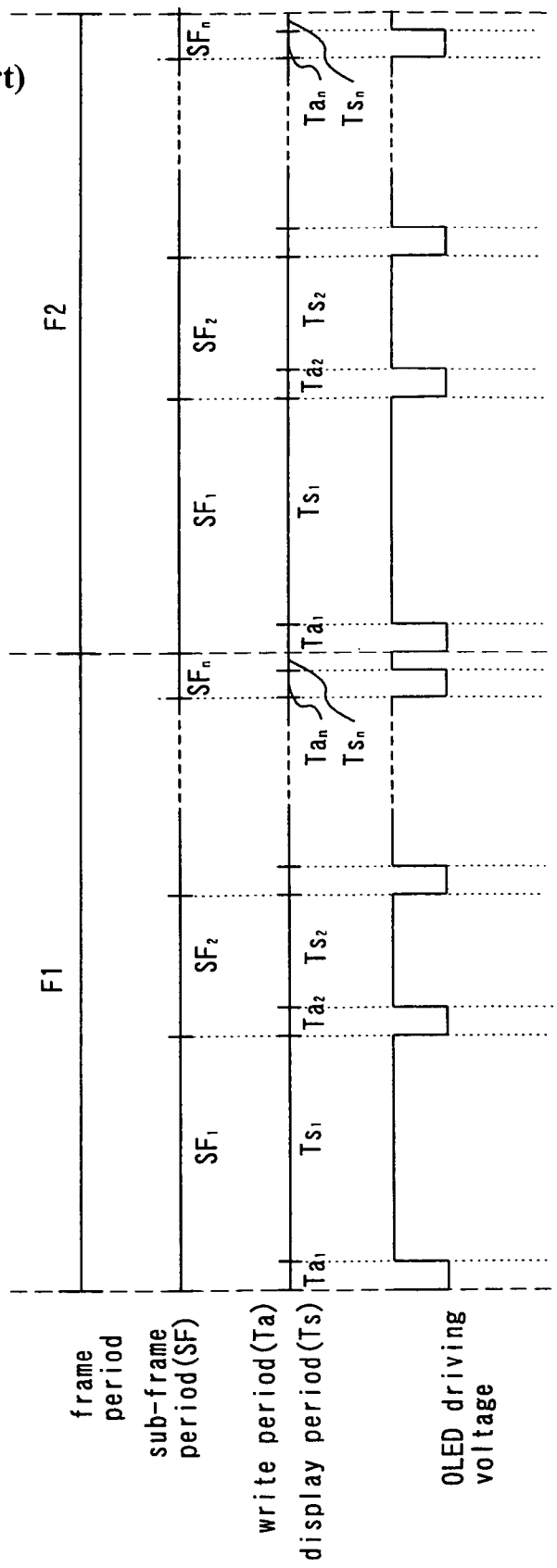
FIG. 5 is a timing chart showing a driving method of the pixel of the conventional display device.
Figure 6:
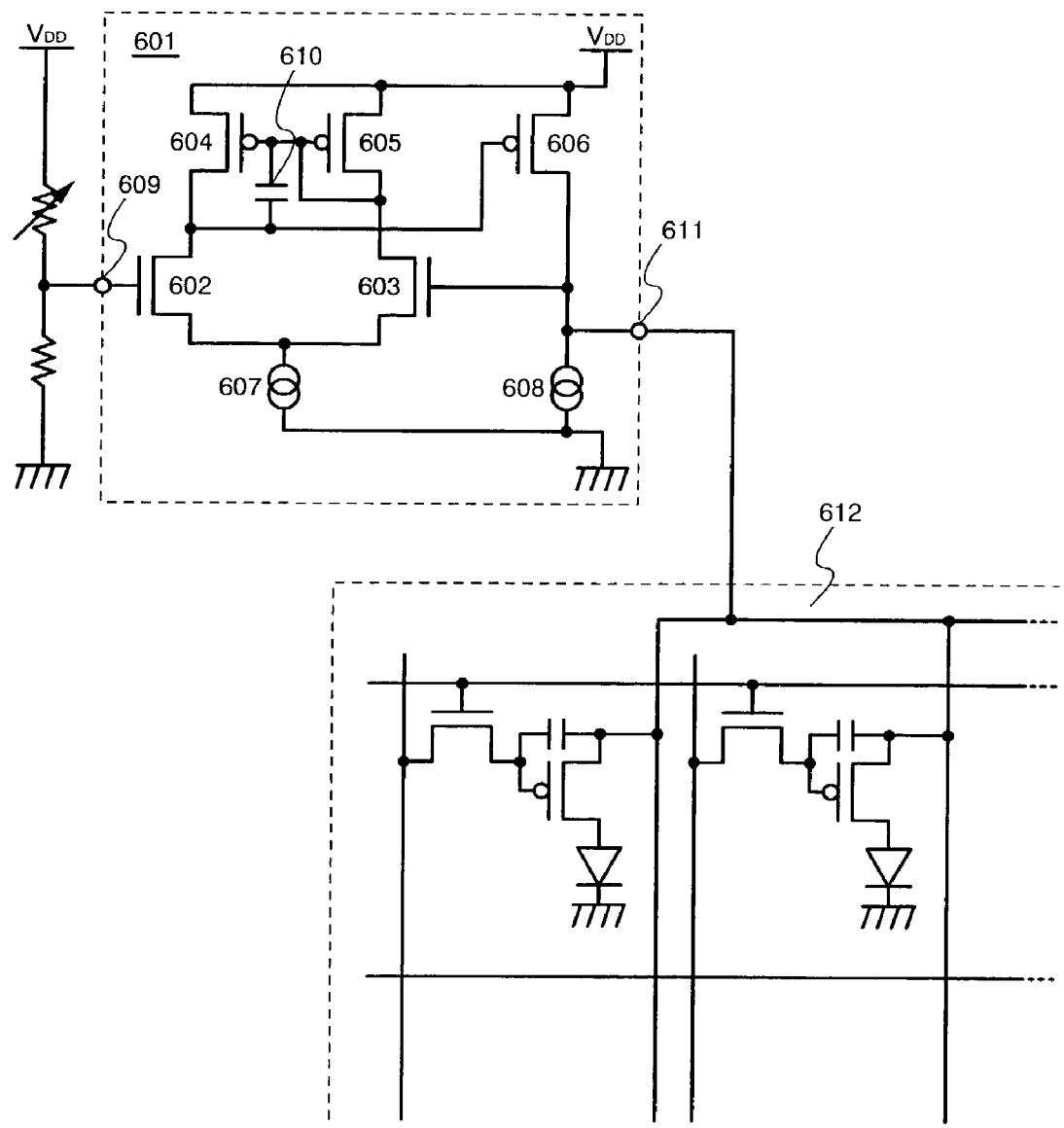
FIG. 6 is a view showing a power source circuit built-in the display device of the present invention.

FIG. 1 shows a construction of the present invention. In the present invention, the OLED display device is integrally formed on a substrate 101, and has a source signal line driving circuit 102, gate signal line driving circuits 103, 104, and a power source circuit 106 as well as a pixel section 105. The power source circuit 106 is constructed by three power source circuits to correspond to three colors of red, green and blue. FIG. 6 shows a concrete example of the power source circuit. The circuit of FIG. 6 is not a source follower circuit as in the conventional example, but is a power source circuit of an operational amplifier type, and can reduce the differential voltage between a power electric potential and an output electric potential by constructing an output circuit formed form p-channel TFTs at an output stage.

The contents of the present invention will next be explained concretely by using FIG. 6.

A voltage as a reference is inputted from the exterior to an input terminal 609. Since the input impedance of the power source circuit 601 is very high, no reference voltage is influenced by the power source circuit 601. Accordingly, the reference voltage may be simply provided by combining a variable resistor and a fixed resistor as shown in FIG. 6. This voltage is inputted to a differential circuit constructed by transistors 602, 603. When the electric potential of an output terminal 611, i.e., the gate electric potential of the transistor 603 is low, the electric current of the transistor 602 becomes larger than the electric current of the transistor 603 since the electric current of the differential circuit is given by a constant electric current source 607. Since transistors 604 and 605 constitute a current mirror circuit, the electric current of the transistor 604 is equal to the electric current of the transistor 603. Accordingly, a capacitor 610 is discharged and a transistor 606 is operated in a direction in which the gate electric potential of the transistor 606 is reduced. An electric current larger than a constant electric current 608 is flowed to the transistor 606, and its output electric potential is raised. Thus, the output electric potential approximately becomes the same electric potential as an input electric potential by performing negative feedback. If an operating point of the output transistor is set to a linear area by using the p-channel transistor of a source ground in the transistor 606 of the output, the output electric potential can be raised until an electric potential close to a power voltage VDD. Namely, the difference between the output voltage and the power voltage can be reduced to the voltage of a threshold value of the p-channel transistor or less. The output terminal 611 of the power source circuit 601 is connected to a power supply line of a pixel section 612 so that the electric current is supplied to pixels.

Here, when the difference between the power voltage VDD and the output voltage is set to 1 V and the characteristics of a conventional OLED element are set to a premise, the power voltage of red becomes 9 V (OLED voltage 8 V+power voltage 1 V). At this time, the differential voltage of green becomes 4 V, and the differential voltage of blue becomes 2 V. The electric power consumptions of the respective colors become 14 mW, 16 mW and 24 mW so that the total electric power consumption becomes 54 mW.

When it is considered that the total electric power consumption is 184 mW in the power source circuit of the source follower type shown in the conventional example, the electric power becomes about one-third by the present invention. Thus, the heating value also becomes about one-third so that the power source circuit can be built-in.

In the above explanation, the OLED material of red is set to be low in light emitting efficiency and the OLED material of green is set to be high in light emitting efficiency. However, the present invention is not limited to this case. The OLED material can be sufficiently practically used even when the material characteristics are hereafter changed and no light emitting efficiency of red becomes low.

Further, in this explanation, the cathode common is set to a premise in the OLED. However, even when an anode common is realized by adopting a top emission system, etc., it is possible to correspond to this anode common. In such a case, the output transistor becomes n-channel of the source ground, and the differential voltage between GND or a negative side power source and the output electric potential can be reduced to the threshold value of n-channel or less. In the circuit of this case, the polarity of the circuit of FIG. 6 is basically inverted.

Here, the OLED display device has been explained, but the present invention can be also applied to a display device using another light emitting element as well as the display device using the OLED element.

Embodiments

The embodiments of the present invention will next be described.

Embodiment 1

Figure 7:
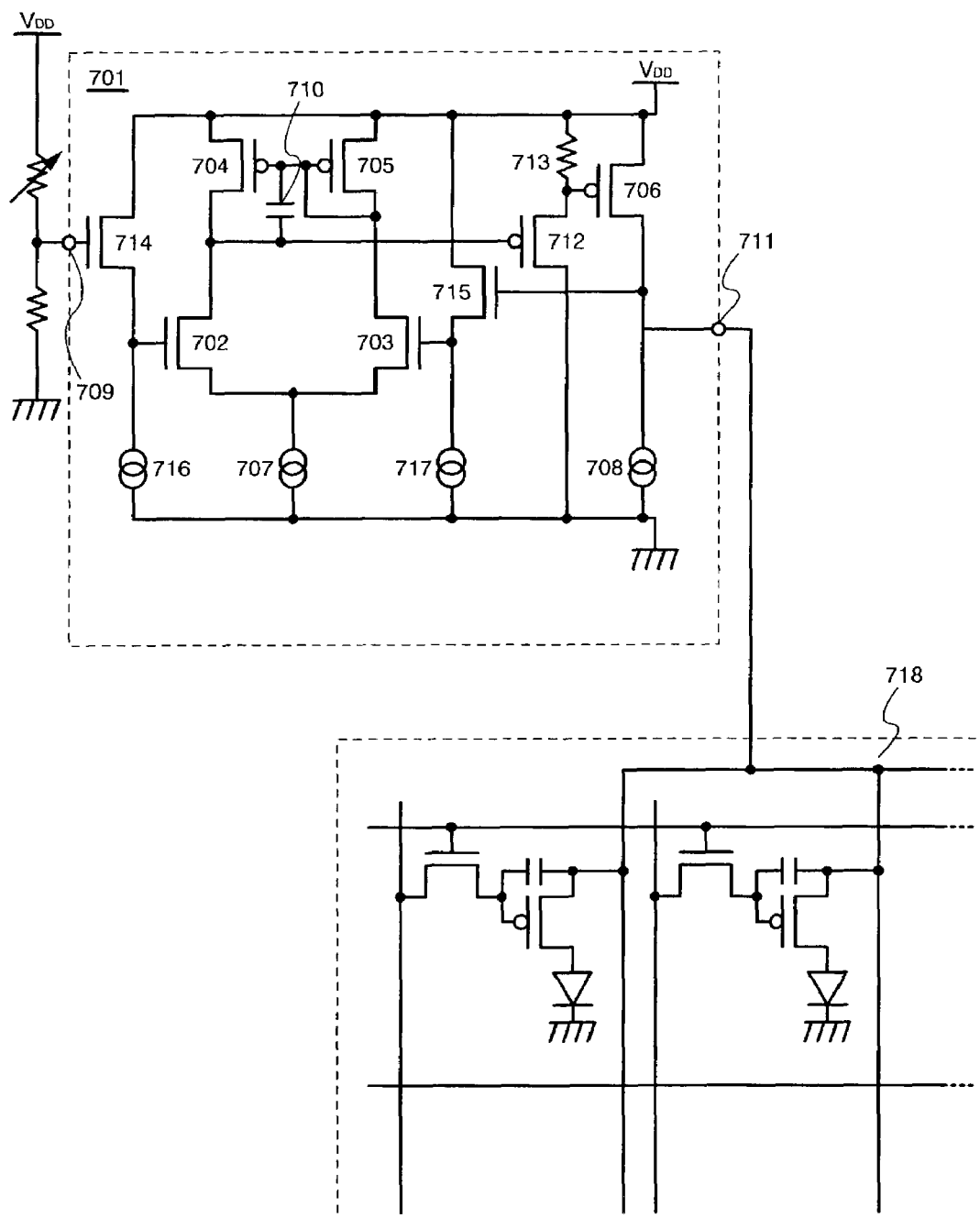
FIG. 7 is a view showing a power source circuit built-in the display device of the present invention.

FIG. 7 shows an embodiment of a power source circuit different from that of the embodiment mode. In the embodiment mode, there is a possibility that impedance seen from a differential circuit is reduced since the output of the differential circuit is directly connected to an output circuit. In this embodiment, to prevent this, a buffer circuit constructed by a transistor 712 and a resistor 713 is inserted between the differential circuit constructed by transistors 702 and 703 and the output circuit constructed by a source ground p-channel transistor 706. The reduction in the impedance of an output stage seen from the differential circuit can be prevented by adding such a buffer circuit. However, the output electric potential of the differential circuit, i.e., the gate electric potential of the transistor 712 is reduced as a defect of this system. Thus, there is a possibility that the gate electric potentials of the transistors 702, 703 are too high in the construction of FIG. 6, and no normal operation can be performed. Therefore, it is necessary to reduce a differential input voltage of the transistors 702, 703 so as to prevent a defect in the operation. As this countermeasure, a buffer circuit constructed by transistors 714, 715 and electric current sources 716, 717 is also arranged in the input of the differential circuit so that the electric potential of the differential circuit is reduced. The impedance can be raised by such a countermeasure without causing the defect in the operation.

In such a circuit, the power source circuit having a small power variation between the input and the output can be supplied even when electric current capacity required in the power source circuit is increased. Similar to the embodiment mode, an output terminal 711 of the power source circuit 701 is connected to the power supply line of a pixel section 718, and the electric current is supplied to pixels.

Similar to the embodiment mode, the cathode common is also set to a premise in the OLED in this embodiment. However, when the anode common is realized by adopting the top emission system, etc., it is also possible to correspond to the anode common. In such a case, the output transistor becomes source ground n-channel transistor, and the difference voltage between GND or a negative side power source and the output electric potential can be set to be smaller than the threshold value of then-channel transistor. In the circuit in this case, the polarity of the circuit of FIG. 7 is basically inverted.

This embodiment can be also applied to a display device using another light emitting element as well as the display device using the OLED element.

Embodiment 2

Figure 8:
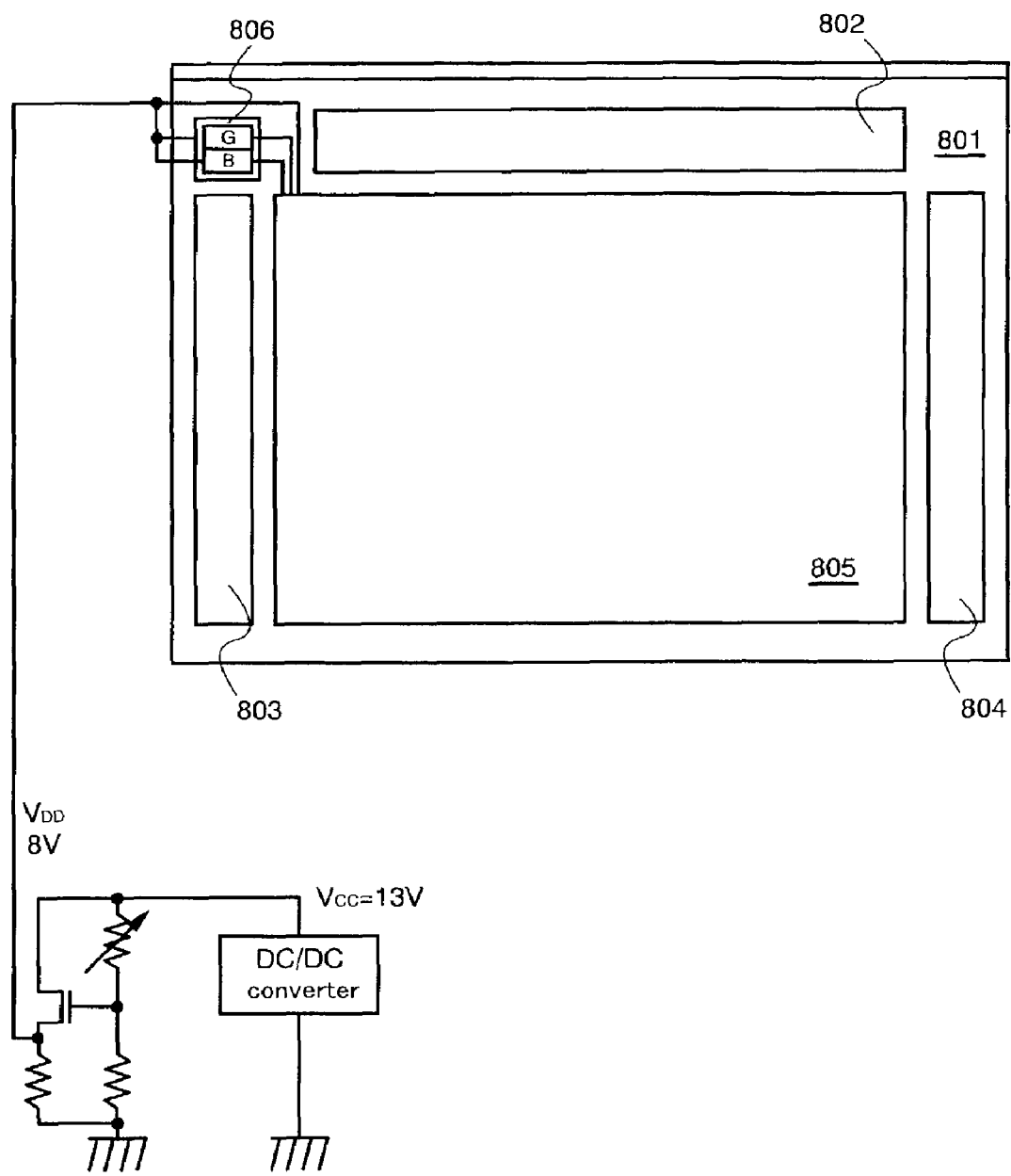
FIG. 8 is a block diagram showing a construction of the display device of the present invention.

FIG. 8 shows a case in which a red light source is externally attached and light sources of the other two colors are built-in. In such a case, it is necessary to stabilize the external light source, but the light sources taken into a panel may be constructed only in two colors so that electric power consumption within the panel can be further reduced.

Further, this embodiment can be also applied to a display device using another light emitting element as well as the display device using the OLED element.

Embodiment 3

In Embodiment 3, a method of simultaneously manufacturing TFTs of a pixel portion of an OLED display device of the present invention and driver circuit portions provided in the periphery thereof (a source signal line driver circuit, a gate signal line driver circuit and a power source circuit). However, in order to simplify the explanation, a CMOS circuit, which is the basic unit for the driver circuit, is shown in the figures.

First, as shown in FIG. 9A, a base film 5002 made of an insulating film such as a silicon oxide film, a silicon nitride film, or a silicon oxynitride film is formed on a substrate 5001 made of glass such as barium borosilicate glass or alumino borosilicate glass, typified by #7059 glass or #1737 glass of Corning Inc. For example, a silicon oxynitride film 5002a fabricated from $SiH_4$, $NH_3$ and $N_2O$ by a plasma CVD method is formed with a thickness of 10 to 200 nm (preferably 50 to 100 nm), and a hydrogenated silicon oxynitride film 5002b similarly fabricated from $SiH_4$ and $N_2O$ is formed with a thickness of 50 to 200 nm (preferably 100 to 150 nm) to form a lamination. In Embodiment 3, although the base film 5002 is shown as the two-layer structure, the film may be formed of a single layer film of the foregoing insulating film or as a lamination structure of more than two layers.

Island-like semiconductor layers 5003 to 5006 are formed of a crystalline semiconductor film manufactured by using a laser crystallization method or by using a known thermal crystallization method on a semiconductor film having an amorphous structure. The thickness of the island-like semiconductor films 5003 to 5006 is set from 25 to 80 nm (preferably between 30 and 60 nm). There is no limitation on the crystalline semiconductor film material, but it is preferable to form the film from a silicon or a silicon germanium (SiGe).

A laser such as a pulse oscillation type or continuous emission type excimer laser, a YAG laser, or a $YVO_4$ laser is used for manufacturing the crystalline semiconductor film in the laser crystallization method. A method of condensing laser light emitted from a laser oscillator into a linear shape by an optical system and then irradiating the light to the semiconductor film may be employed when these types of lasers are used. The crystallization conditions may be suitably selected by the operator, but the pulse oscillation frequency is set to 30 Hz, and the laser energy density is set from 100 to 400 $mJ/cm^2$ (typically between 200 and 300 $mJ/cm^2$) when using the excimer laser. Further, the second harmonic is utilized when using the YAG laser, the pulse oscillation frequency is set from 1 to 10 kHz, and the laser energy density may be set from 300 to 600 $mJ/cm^2$ (typically between 350 and 500 $mJ/cm^2$). The laser light which has been condensed into a linear shape with a width of 100 to 1000 μm, for example 400 μm, is then irradiated over the entire surface of the substrate. This is performed with an overlap ratio of 80 to 98% in case of the linear laser light. Moreover, a CWLC disclosed in Japanese Patent Application No. 2001-365302 may be used as the laser crystallization.

Next, a gate insulating film 5007 is formed covering the island-like semiconductor layers 5003 to 5006. The gate insulating film 5007 is formed of an insulating film containing silicon with a thickness of 40 to 150 nm by a plasma CVD method or a sputtering method. A 120 nm thick silicon oxynitride film is formed in Embodiment 3. The gate insulating film 5007 is not limited to such a silicon oxynitride film, of course, and other insulating films containing silicon may also be used, in a single layer or in a lamination structure. For example, when using a silicon oxide film, it can be formed by the plasma CVD method with a mixture of TEOS (tetraethyl orthosilicate) and $O_2$, at a reaction pressure of 40 Pa, with the substrate temperature set from 300 to 400° C., and by discharging at a high frequency (13.56 MHz) with electric power density of 0.5 to 0.8 W/cm$^2$. Good characteristics of the silicon oxide film thus manufactured as a gate insulating film can be obtained by subsequently performing thermal annealing at 400 to 500° C.

A first conductive film 5008 and a second conductive film 5009 are then formed on the gate insulating film 5007 in order to form gate electrodes. In Embodiment 3, the first conductive film 5008 is formed from Ta with a thickness of 50 to 100 nm, and the second conductive film 5009 is formed from W with a thickness of 100 to 300 nm.

The Ta film is formed by sputtering, and sputtering of a Ta target is performed by using Ar. If an appropriate amount of Xe or Kr is added to the Ar during sputtering, the internal stress of the Ta film will be relaxed, and film peeling can be prevented. The resistivity of an α phase Ta film is on the order of 20 μΩcm, and the Ta film can be used for the gate electrode, but the resistivity of a β phase Ta film is on the order of 180 μΩcm and the Ta film is unsuitable for the gate electrode. The α phase Ta film can easily be obtained if a tantalum nitride film, which possesses a crystal structure similar to that of α phase of Ta, is formed with a thickness of 10 to 50 nm as a base for Ta in order to form the α phase Ta film.

The W film is formed by sputtering with W as a target. The W film can also be formed by a thermal CVD method using tungsten hexafluoride ($WF_6$). Whichever is used, it is necessary to make the film low resistant in order to use it as the gate electrode, and it is preferable that the resistivity of the W film be set 20 μΩcm or less. The resistivity can be lowered by enlarging the crystal grains of the W film, but for cases where there are many impurity elements such as oxygen within the W film, crystallization is inhibited, and the film becomes high resistant. A W target having a purity of 99.9999% is thus used in sputtering. In addition, by forming the W film while taking sufficient care such that no impurities from the inside of the gas phase are introduced at the time of film formation, a resistivity of 9 to 20 μΩcm can be achieved.

Note that although the first conductive film 5008 and the second conductive film 5009 are formed from Ta and W, respectively, in this embodiment, the conductive films are not limited to these. Both the first conductive film 5008 and the second conductive film 5009 may also be formed from an element selected from the group consisting of Ta, W, Ti, Mo, Al, and Cu, or from an alloy material or a chemical compound material having one of these elements as its main constituent. Further, a semiconductor film, typically a polysilicon film, into which an impurity element such as phosphorus is doped, may also be used. Examples of preferable combinations other than that in Embodiment 3 include: the first conductive film 5008 formed from tantalum nitride (TaN) and the second conductive film 5009 formed from W; the first conductive film 5008 formed from tantalum nitride (TaN) and the second conductive film 5009 formed from Al; and the first conductive film 5008 formed from tantalum nitride (TaN) and the second conductive film 5009 formed from Cu.

Next, a mask 5010 made of resist is formed, and a first etching process is performed in order to form electrodes and wirings. An ICP (inductively coupled plasma) etching method is used in Embodiment 3. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), substantially applying a negative self-bias voltage. The W film and the Ta film are both etched on the same order when $CF_4$ and $Cl_2$ are mixed.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 450. The etching time may be increased by approximately 10 to 20% in order to perform etching without any residue on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011a to 5016a and second conductive layers 5011b to 5016b) are thus formed of the first conductive layer and the second conductive layer by the first etching process. At this point, regions of the gate insulating film 5007 not covered by the first shape conductive layers 5011 to 5016 are made thinner by approximately 20 to 50 nm by etching (FIG. 9B).

Then, a first doping process is performed to add an impurity element for imparting an n-type conductivity. Doping may be carried out by an ion doping method or an ion implanting method. The condition of the ion doping method is at a dosage of $1\times10^{13}$ to $5\times10^{14}$ atoms/cm$^2$, and an acceleration voltage is 60 to 100 keV. As the impurity element for imparting the n-type conductivity, an element belonging to group 15, typically phosphorus (P) or arsenic (As) is used, but phosphorus is used here. In this case, the conductive layers 5011 to 5015 become masks to the impurity element to impart the n-type conductivity, and first impurity regions 5017 to 5025 are formed in a self-aligning manner. The impurity element to impart then-type conductivity in the concentration range of $1\times10^{20}$ to $1\times10^{21}$ atoms/cm$^3$ is added to the first impurity regions 5017 to 5025 (FIG. 9B).

Next, as shown in FIG. 9C, a second etching process is performed without removing the resist mask. The etching gas of the mixture of $CF_4$, $Cl_2$ and $O_2$ is used, and the W film is selectively etched. At this point, second shape conductive layers 5026 to 5031 (first conductive layers 5026a to 503a and second conductive layers 5026b to 5031b) are formed by the second etching process. Regions of the gate insulating film 5007, which are not covered with the second shape conductive layers 5026 to 5031 are made thinner by about 20 to 50 nm by etching.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, the vapor pressure of $WF_6$ of fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Then, as shown in FIG. 10A, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1\times10^{13}$ atoms/cm$^2$, so that new impurity regions are formed inside of the first impurity regions formed into the island-like semiconductor layers in FIG. 9B. Doping is carried out such that the second shape conductive layers 5026 to 5030 are used as masks to the impurity element and the impurity element is added also to the regions under the first conductive layers 5026a to 5030a. In this way, third impurity regions 5032 to 5036 are formed. The concentration of phosphorus (P) added to the third impurity regions 5032 to 5036 has a gentle concentration gradient in accordance with the thickness of tapered portions of the first conductive layers 5026a to 5030a. Note that in the semiconductor layer that overlap with the tapered portions of the first conductive layers 5026a to 5030a, the concentration of impurity element slightly falls from the end portions of the tapered portions of the first conductive layers 5026a to 5030a toward the inner portions, but the concentration keeps almost the same level.

As shown in FIG. 10B, a third etching process is performed. This is performed by using a reactive ion etching method (RIE method) with an etching gas of $CHF_6$. The tapered portions of the first conductive layers 5026a to 5030a are partially etched, and the region in which the first conductive layers overlap with the semiconductor layer is reduced by the third etching process. Third shape conductive layers 5037 to 5042 (first conductive layers 5037a to 5042a and second conductive layers 5037b to 5042b) are formed. At this point, regions of the gate insulating film 5007, which are not covered with the third shape conductive layers 5037 to 5042 are made thinner by about 20 to 50 nm by etching.

By the third etching process, in third impurity regions 5032 to 5036, third impurity regions 5032a to 5036a, which overlap with the first conductive layers 5037a to 5041a, and second impurity regions 5032b to 5236b between the first impurity regions and the third impurity regions are formed.

Then, as shown in FIG. 10C, fourth impurity regions 5043 to 5048 having a conductivity type opposite to the first conductivity type are formed in the island-like semiconductor layer 5004 for forming p-channel TFTs. The third shape conductive layer 5038b is used as masks to an impurity element, and the impurity regions are formed in a self-aligning manner. At this time, the whole surfaces of the island-like semiconductor layers 5003, 5005 and 5006 and the wiring portion 5042, which form n-channel TFTs are covered with a resist mask 5200. Phosphorus is added to the impurity regions 5043 to 5048 at different concentrations, respectively. The regions are formed by an ion doping method using diborane ($B_2H_6$) and the impurity concentration is made $2\times10^{20}$ to $2\times10^{21}$ atoms/cm$^3$ in any of the regions.

By the steps up to this, the impurity regions are formed in the respective island-like semiconductor layers. The third shape conductive layers 5037 to 5041 overlapping with the island-like semiconductor layers function as gate electrodes. The conductive layer 5042 functions as an island-like source signal line.

After the resist mask 5200 is removed, a step of activating the impurity elements added in the respective island-like semiconductor layers is performed for the purpose of controlling the conductivity type. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In this embodiment, a heat treatment is conducted at 500° C. for 4 hours. However, in the case where a wiring material used for the third shape conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is a step of terminating dangling bonds in the semiconductor layers by thermally excited hydrogen. As another means for hydrogenation, plasma hydrogenation (using hydrogen excited by plasma) may be carried out.

Next, as shown in FIG. 11A, a first interlayer insulating film 5055 having a thickness of 100 to 200 nm is formed of a silicon oxynitride film. A second interlayer insulating film 5056 made of an organic insulator material is formed thereon. Contact holes are then formed with respect to the first interlayer insulating film 5055, the second interlayer insulating film 5056, and the gate insulating film 5007, respective wirings (including connection wirings and signal lines) 5057 to 5062, and 5064 are formed by patterning, and then, a pixel electrode 5063 that contacts with the connection wiring 5062 is formed by patterning.

Next, the film made from organic resin is used for the second interlayer insulating film 5056. As the organic resin, polyimide, polyamide, acryl, BCB (benzocyclobutene) or the like can be used. Especially, since the second interlayer insulating film 5056 has rather the meaning of flattening, acryl is desirable in flatness. In this embodiment, an acryl film is formed to such a thickness that stepped portions formed by the TFTs can be adequately flattened. The thickness is preferably made 1 to 5 μm (more preferably 2 to 4 μm).

In the formation of the contact holes, dry etching or wet etching is used, and contact holes reaching the n-type impurity regions 5017, 5018, 5021 and 5023 to 5025 or the p-type impurity regions 5043 to 5048, a contact hole reaching the wiring 5042, a contact hole reaching the power supply line (not shown), and contact holes reaching the gate electrodes (not shown) are formed, respectively.

Further, a lamination film of a three layer structure, in which a 100 nm thick Ti film, a 300 nm thick aluminum film containing Ti, and a 150 nm thick Ti film are formed in succession by sputtering, is patterned into a desirable shape, and the resultant lamination film is used as the wirings (including connection wirings and signal lines) 5057 to 5062, and 5064. Of course, other conductive films may be used.

Furthermore, in this embodiment, an MgAg film is formed with a thickness of 110 nm, and patterning is performed to form the pixel electrode 5063. The pixel electrode 5063 is arranged so as to contact and overlap the connection wiring 5062 so that contact is obtained. This pixel electrode 5063 corresponds to a cathode of an OLED element (FIG. 11A).

Next, as shown in FIG. 11B, an insulating film containing silicon (a silicon oxide film in this embodiment) is formed with a thickness of 500 nm, an opening portion is formed at the position corresponding to the pixel electrode 5063, and then, a third interlayer insulating film 5065 that functions as a bank is formed. In forming the opening portion, side walls having a tapered shape may be easily formed by using wet etching. The deterioration of the OLED layer due to stepped portion becomes a remarkable problem if the side walls of the opening portion are not sufficiently flat.

An OLED layer 5066 and an anode (opposite electrode) 5067 are formed next in succession, without exposure to the atmosphere, by using a vacuum evaporation method. Note that the film thickness of the OLED layer 5066 may be set from 80 to 200 nm (typically between 100 to 120 nm), and the anode 5067 is formed from ITO film.

The OLED layer and the anode are formed one after another with respect to pixels corresponding to the color red, pixels corresponding to the color green, and pixels corresponding to the color blue. However, the OLED layer is weak with respect to a solution, and therefore the OLED layer and the anode must be formed with respect to each of the colors without using a photolithography technique. It is preferable to cover areas outside of the desired pixels using a metal mask, and selectively form the OLED layer and the anode only in the necessary locations.

In other words, a mask is first set so as to cover all pixels except for those corresponding to the color red, and the OLED layer for emitting red color light is selectively formed using the mask. Next, a mask is set so as to cover all pixels except for those corresponding to the color green, and the OLED layer for emitting green color light is selectively formed using the mask. Similarly, a mask is set so as to cover all pixels except for those corresponding to the color blue, and the OLED layer for emitting blue color light is selectively formed using the mask. Note that the use of all different masks is stated here, but the same mask may also be reused.

The method of forming three kinds of OLED elements corresponding to the colors RGB is used here, but a method of combining a white color light emitting OLED element and a color filter, a method of combining a blue or blue-green color light emitting OLED element and a fluorescent body (fluorescent color conversion layer: CCM), a method of using a transparent electrode as a cathode (pixel electrode) and overlapping it with OLED elements each corresponding to one of the colors RGB and the like may be used.

A known material can be used as the OLED layer 5066. Considering the driver voltage, it is preferable to use an organic material as the known material. For example, a four layer structure constituted of a hole injecting layer, a hole transporting layer, a light emitting layer and an electron injecting layer may be adopted as an OLED layer.

Next, the anode 5067 is formed using a metal mask on the pixels having the switching TFTs of which the gate electrodes are connected to the same gate signal line (pixels on the same line).

Note that, in this embodiment, although ITO is used as the anode 5067 and MgAg is used as the cathode 5063, the present invention is not limited to this. Other known materials may be used for the anode 5067 and the cathode 5063.

Finally, a passivation film 5068 made of a silicon nitride film is formed with a thickness of 300 nm. The formation of the passivation film 5068 enables the OLED layer 5066 to be protected against moisture and the like, and the reliability of the OLED element can further be enhanced.

Consequently, the OLED display device with the structure as shown in FIG. 11B is completed. Note that, in the manufacturing process of the OLED display device in this embodiment, the source signal lines are formed from Ta and W, which are materials for forming gate electrodes, and the gate signal lines are formed from Al, which is a wiring material for forming the source electrode and the drain electrode because of the circuit configuration and the process, but different materials may be used.

TFT in the active matrix type OLED display device formed by the aforementioned steps has a top gate structure, but this embodiment can be easily applied to a bottom gate structure TFT and other structure TFT.

Further, the glass substrate is used in this embodiment, but it is not limited. Other than glass substrate, such as the plastic substrate, the stainless substrate and the single crystalline wafers can be used to implement.

Incidentally, the OLED display device in this embodiment exhibits the very high reliability and has the improved operational characteristic by providing TFTs having the most suitable structure in not only the pixel portion but also the driver circuit portion. Further, it is also possible to add a metallic catalyst such as Ni in the crystallization process, thereby increasing crystallinity. It therefore becomes possible to set the driving frequency of the source signal line driver circuit to 10 MHz or higher.

First, a TFT having a structure in which hot carrier injection is reduced without decreasing the operating speed as much as possible is used as an n-channel TFT of a CMOS circuit forming the driver circuit portion.

In this embodiment, the active layer of the n-channel TFT contains the source region, the drain region, the overlapping LDD (lightly doped drain) region overlapping with the gate electrode with the gate insulating film sandwiched therebetween (Lov region), the offsetting LDD region not overlapping with the gate electrode with the gate insulating film sandwiched therebetween (Loff region), and the channel forming region.

Further, there is not much need to worry about degradation due to the hot carrier injection with the p-channel TFT of the CMOS circuit, and therefore LDD regions may not be formed in particular. It is of course possible to form LDD regions similar to those of the n-channel TFT, as a measure against hot carriers.

In addition, when using a CMOS circuit in which electric current flows bi-directionally in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. Further, when a CMOS circuit in which it is necessary to suppress the value of the off current as much as possible is used, the n-channel TFT forming the CMOS circuit preferably has an Lov region.

Note that, in practice, it is preferable to perform packaging (sealing), without exposure to the atmosphere, using a protecting film (such as a laminated film or an ultraviolet cured resin film) having good airtight properties and little out gassing, or a transparent sealing material, after completing through the state of FIG. 11B. At this time, the reliability of the OLED element is increased by making an inert atmosphere inside the sealing material and by arranging a hygroscopic material (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed.

Furthermore, in accordance with the process shown in this embodiment, the number of photo masks required for manufacture of an OLED display device can be suppressed. As a result, the process can be shortened, and the reduction of the manufacturing cost and the improvement of the yield can be attained.

The aforementioned manufacturing step can be applied to the manufacturing step of the display device using TFTs with a single polarity that is structured by only N-type TFT if the manufacturing step of p-type TFT is removed.

The manufacturing step is not limited to aforementioned. The structure of TFT constituting the display device is not limited to a top gate type TFT, for example, bottom gate type TFT or a dual gate type TFT may also be used.

Further, the present invention is applicable to not only the display device using the OLED element but also the display device using other light emitting elements.

Embodiment 4

In this embodiment, an example of fabricating an OLED display device of the present invention will be described with reference to FIGS. 12A to 12C.

Figure 12A:
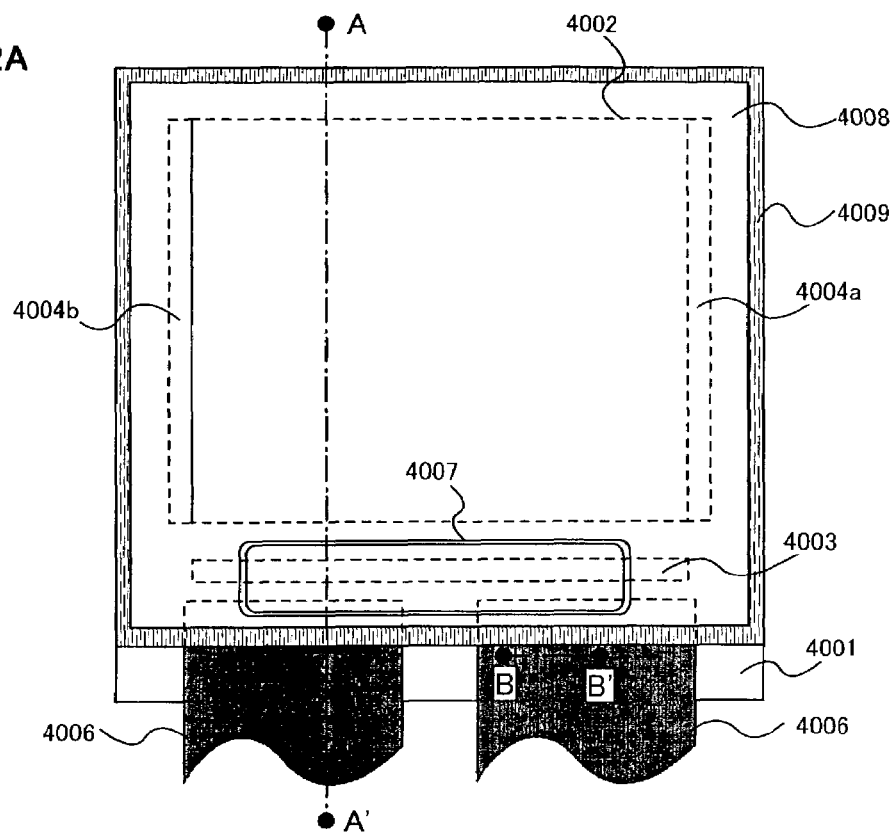
FIG. 12A is a top view showing the external appearance of the display device of the present invention.
Figure 12B:
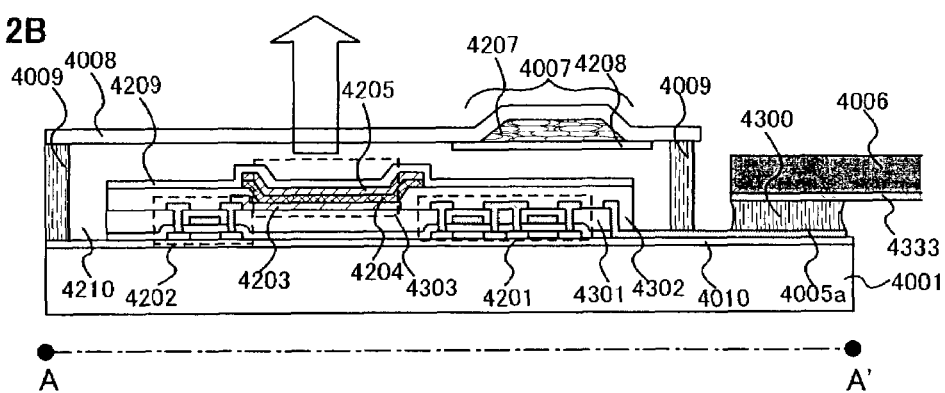
FIGS. 12B and 12C are sectional views showing the external appearance of the display device of the present invention.
Figure 12C:
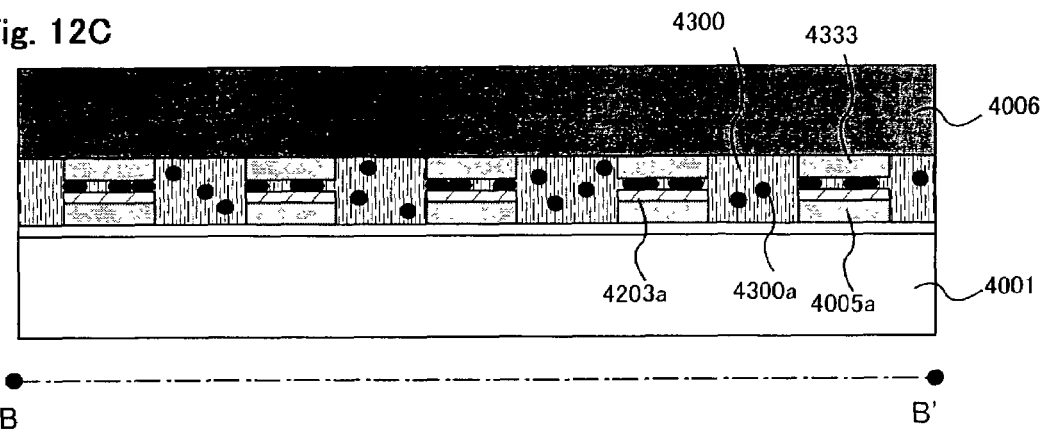

FIG. 12A is a top view of the OLED display device, FIG. 12B is a sectional view taken along a line A-A' of FIG. 12A, and FIG. 12C is a sectional view taken along a line B-B' of FIG. 12A.

A seal member 4009 is provided so as to surround a pixel portion 4002, a source signal line driving circuit 4003, and first and second gate signal line driving circuits 4004a and 4004b, which are provided on a substrate 4001. Further, a sealing member 4008 is provided over the pixel portion 4002, the source signal line driving circuit 4003, and the first and the second gate signal line driving circuits 4004a and 4004b. Thus, the pixel portion 4002, the source signal line driving circuit 4003, and the first and the second gate signal line driving circuits 4004a and 4004b are sealed with a filler 4210 by the substrate 4001, the seal member 4009, and the sealing member 4008.

Further, the pixel portion 4002, the source signal line driving circuit 4003, and the first and the second gate signal line driving circuits 4004a and 4004b provided on the substrate 4001 include a plurality of TFTs. FIG. 12B typically shows driving TFTs (here, an n-channel TFT and a p-channel TFT are shown) 4201 included in the source signal line driving circuit 4003 and a pixel TFT 4202 (a TFT for inputting drain current to an OLED element) included in the pixel portion 4002, which are formed on an base film 4010.

In this embodiment, the p-channel TFT and the n-channel TFT fabricated by a well-known method are used as the driving TFTs 4201, and a p-channel TFT fabricated by a well-known method is used as the TFT 4202.

An interlayer insulating film (flattening film) 4301 is formed on the driving TFTs 4201 and the TFT 4202, and a pixel electrode (anode) 4203 electrically connected to a drain region of the TFT 4202 is formed thereon. A transparent conductive film with a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film doped with gallium may be used.

An insulating film 4302 is formed on the pixel electrode 4203, and an opening portion is formed in the insulating film 4302 over the pixel electrode 4203. In this opening portion, an OLED layer 4204 is formed on the pixel electrode 4203. A well-known organic material or inorganic material can be used for the OLED layer 4204. Although the organic material includes a low molecular (monomer) material and a high molecular (polymer) material, either may be used.

As a formation method of the OLED layer 4204, a well-known evaporation technique or coating technique may be used. The structure of the OLED layer may be a laminate structure obtained by freely combining any of a hole injecting layer, a hole transporting layer, a light emitting layer, an electron transporting layer, and an electron injecting layer, or a single layer structure.

A cathode 4205 of a conductive film (typically, a conductive film containing aluminum, copper or silver as its main component, or a laminate film of the above film and another conductive film) with a light shielding property is formed on the OLED layer 4204. It is desirable that moisture and oxygen existing on the interface between the cathode 4205 and the OLED layer 4204 are removed to the utmost. Accordingly, it is necessary to make such contrivance that the OLED layer 4204 is formed in a nitrogen or rare gas atmosphere, and the cathode 4205 is formed while the OLED layer is not exposed to oxygen or moisture. In this embodiment, a film forming apparatus with a multi-chamber system (cluster tool system) is used, and the film formation as described above is enabled. A predetermined voltage is applied to the cathode 4205.

As described above, an OLED element 4303 constituted by the pixel electrode (anode) 4203, the OLED layer 4204, and the cathode 4205 is formed. Then, a protection film 4209 is formed on the insulating film 4302 so as to cover the OLED element 4303. The protection film 4209 is effective to prevent oxygen, moisture and the like from penetrating into the OLED element 4303.

Reference numeral 4005a designates a drawing wiring line connected to a power supply line and electrically connected to a source region of the TFT 4201. The drawing wiring line 4005a is formed between the seal member 4009 and the substrate 4001, and electrically connected to an FPC wiring line 4333 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet which has such a structure that an aluminum foil is interposed between PVF films or Mylar films can also be used.

However, in the case where the radiation direction of light from the OLED element is directed toward the side of the sealing member, the sealing member must be transparent. In this case, a transparent material such as a glass plate, a plastic plate, a polyester film, or an acryl film is used.

As the filler 4210, in addition to an inert gas such as nitrogen or argon, ultraviolet ray curing resin or thermosetting resin can be used. PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4210 to a hygroscopic material (preferably, barium oxide) or a material which is capable of absorbing oxygen, a recess portion 4007 is provided on the surface of the sealing member 4008 at the side of the substrate 4001, and the hygroscopic material or the material which is capable of absorbing oxygen 4207 is disposed. Then, in order to prevent the hygroscopic material or the material capable of absorbing oxygen 4207 from scattering, the hygroscopic material or the material capable of absorbing oxygen are held in the recess portion 4007 by a recess cover member 4208. Note that, the recess cover member 4208 is formed into a fine mesh, and has such a structure that air and moisture are permeated and the hygroscopic material or the material capable of absorbing oxygen 4207 is not permeated. The deterioration of the OLED element 4303 can be suppressed by providing therewith the hygroscopic material or the material capable of absorbing oxygen 4207.

As shown in FIG. 12C, in forming the pixel electrode 4203, a conductive film 4203a is simultaneously formed to be in contact with the drawing wiring line 4005a.

The anisotropic conductive film 4300 includes a conductive filler 4300a. When the substrate 4001 and the FPC 4006 are thermally compressed, the conductive film 4203a over the substrate 4001 and the FPC wiring line 4333 on the FPC 4006 are electrically connected through the conductive filler 4300a.

Further, the present invention can be applicable to not only the display device using the OLED element but also the display device using other light emitting elements.

Embodiment 5

Figure 13A:
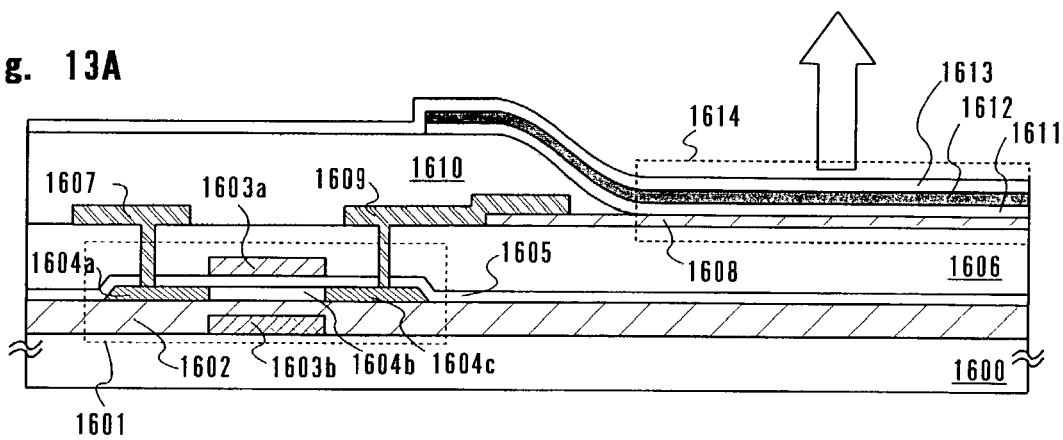
FIGS. 13A and 13B are sectional views showing a construction of a pixel of the display device of the present invention.
Figure 13B:
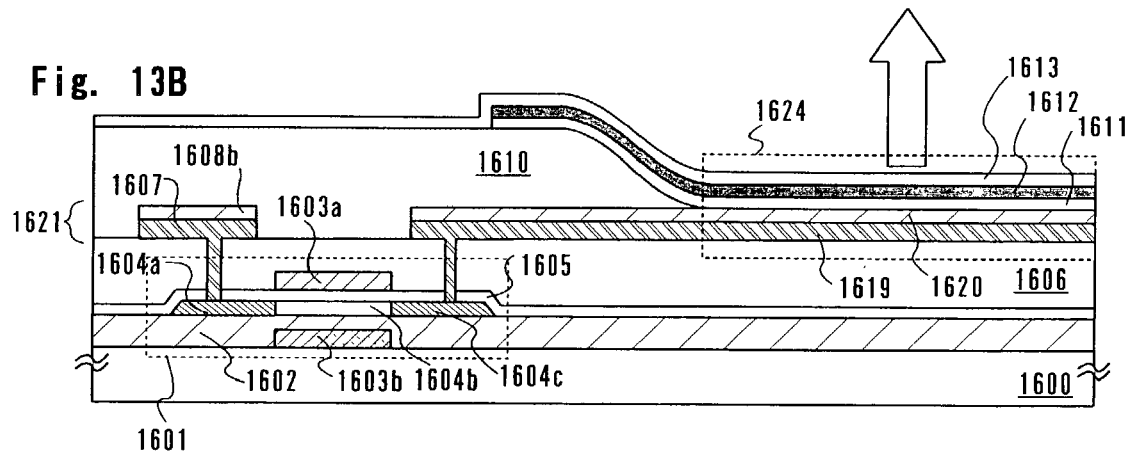

FIGS. 13A and 13B show sectional views illustrating the pixel structure of the OLED display device of the present invention. In this embodiment, a TFT for making a drain current flow to an OLED element is shown alone as one of elements which constitute a pixel of the OLED display device.

In FIG. 13A, a TFT 1601 is formed on a pixel substrate 1600. The TFT 1601 is a dual-gate TFT that has a first gate electrode 1603a, a second gate electrode 1603b, and a channel formation region 1604b. The channel formation region 1604b is sandwiched between the first electrode and the second gate electrode through the insulating film 1602 and the insulating film 1605. The TFT 1601 has a source region and a drain region, and one of which is denoted by 1604a and the other of which is denoted by 1604c. After the TFT 1601 is formed, an interlayer film 1606 is formed.

The structure of the TFT 1601 is not limited to the one shown in the drawing. A TFT with any known structure can be employed as the TFT 1601.

Formed next is a transparent conductive film, typically an ITO film, which is then patterned into a desired shape to obtain a pixel electrode 1608. The pixel electrode 1608 here serves as an anode. Contact holes reaching the source region and drain region, namely 1604a and 1604c, of the TFT 1601 are formed in the interlayer film 1606. A laminate film consisting of a Ti layer, an Al layer containing Ti, and another Ti layer is formed and patterned into a desired shape to obtain wiring lines 1607 and 1609. The TFT is made conductive by contacting the wiring line 1609 to the pixel electrode 1608.

Then, an insulating film is formed from an organic resin material such as acrylic. An opening portion is formed in the insulating film at a position that coincides with the position of the pixel electrode 1608 of an OLED element 1614 to obtain an insulating film 1610. The opening portion has to be formed to have side walls tapered gently in order to avoid degradation or discontinuation of the OLED layer due to the level difference in side walls of the opening portion.

An OLED layer 1611 is formed next. Thereafter, an opposite electrode (cathode) 1612 of the OLED element 1614 is formed from a laminate film consisting of a cesium (Cs) film with 2 nm or less in thickness and a silver (Ag) film with 10 nm or less in thickness which are layered in order. If the opposite electrode 1612 of the OLED element 1614 is very thin, light generated in the OLED layer 1611 is transmitted through the opposite electrode 1612 and emitted in the opposite direction to the pixel substrate 1600. Next, a protective film 1613 is formed in order to protect the OLED element 1614.

In the display device that emits light in the opposite direction to the pixel substrate 1600, it is not necessary that light emitted from the OLED element 1614 to be viewed travels through the elements such as the TFT 1601 formed over the pixel substrate 1600. Therefore, the display devices can have a large aperture ratio.

The pixel electrode 1608 may serve as a cathode while the opposite electrode 1612 serves as an anode if TiN or the like is used to form the pixel electrode and a transparent conductive film such as an ITO film is used for the opposite electrode. Then, light generated in the OLED layer 1611 can be emitted from the anode side in the opposite direction to the pixel substrate 1600.

FIG. 13B is a sectional view showing the structure of a pixel that has an OLED element structured differently from FIG. 13A.

Components in FIG. 13B that are identical with those in FIG. 13A are denoted by the same reference symbols in the explanation.

The pixel of FIG. 13B is formed in accordance with the same process as that for the pixel of FIG. 13A up to forming the TFT 1601 and the interlayer film 1606.

Next, contact holes reaching the source region and drain region, 1604a and 1604c, of the TFT 1601 are formed in the interlayer film 1606. Thereafter, a laminate film consisting of a Ti layer, an Al layer containing Ti, and another Ti layer is formed, and a transparent conductive film, typically an ITO film, is formed in succession. The laminate film and the transparent conductive film are patterned into desired shapes to obtain wiring lines 1621 and 1619, which are composed of wiring lines 1607 and 1608b, and a pixel electrode 1620. The pixel electrode 1620 serves as an anode of an OLED element 1624.

Then, an insulating film is formed from an organic resin material such as acrylic. An opening portion is formed in the insulating film at a position that coincides with the position of the pixel electrode 1620 of the OLED element 1624 to obtain the insulating film 1610. The opening portion has to be formed to have side walls tapered gently in order to avoid degradation or discontinuation of the OLED layer due to the level difference in side walls of the opening portion.

The OLED layer 1611 is formed next. Thereafter, an opposite electrode (cathode) 1612 of the OLED element 1624 is formed from a laminate film consisting of a cesium (Cs) film with 2 nm or less in thickness and a silver (Ag) film with 10 nm or less in thickness which are layered in order. If the opposite electrode 1612 of the OLED element 1624 is very thin, light generated in the OLED layer 1611 is transmitted through the opposite electrode 1612 and emitted in the opposite direction to the pixel substrate 1600. Next, the protective film 1613 is formed in order to protect the OLED element 1624.

In the display device that emits light in the opposite direction to the pixel substrate 1600, it is not necessary that light emitted from the OLED element 1624 to be viewed travels through the elements such as the TFT 1601 formed over the pixel substrate 1600. Therefore, the display devices can have a large aperture ratio.

The pixel electrode 1620 and the wiring line 1621 may serve as a cathode while the opposite electrode 1612 serves as an anode if TiN or the like is used to form the pixel electrode and a transparent conductive film such as an ITO film is used for the opposite electrode. Then, light generated in the OLED layer 1611 can be emitted from the anode side in the opposite direction to the pixel substrate 1600.

In this case, it is necessary to structure the TFT for making current flow to an OLED element in the display device of the present invention by using n-type.

Compared to the pixel with the structure as shown in FIG. 13A, the pixel with the structure as shown in FIG. 13B can reduce the number of photo masks required in the manufacturing process and can simplify the process since the wiring line 1619, which is connected to the source region or drain region of the TFT, and the pixel electrode 1620 can be patterned by using the same photo mask.

Further, the present embodiment can be applicable to not only the display device using the OLED element but also the display device using other elements.

Embodiment 6

In this embodiment, an external light emitting quantum efficiency can be remarkably improved by using an organic light emitting material by which phosphorescence from a triplet exciton can be employed for emitting a light. As a result, the power consumption of the light emitting element can be reduced, the lifetime of the light emitting element can be elongated and the weight of the light emitting element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical formula 1)

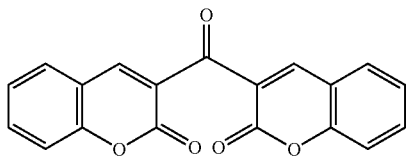

(M. A. Baldo, D. F. O'Brien, Y. You, A. Shoustikov, S. Sibley, M. E. Thompson, S. R. Forrest, Nature 395 (1998) p. 151)

The molecular formula of an organic light emitting material (Pt complex) reported by the above article is represented as follows.

(Chemical formula 2)

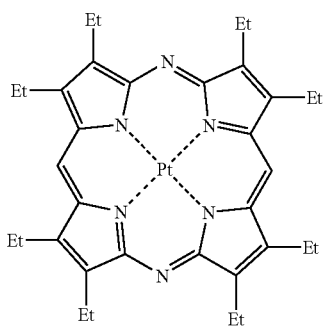

(M. A. Baldo, S. Lamansky, P. E. Burrows, M. E. Thompson, S. R. Forrest, Appl. Phys. Lett., 75 (1999) p. 4.)

(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic light emitting material (Ir complex) reported by the above article is represented as follows.

(Chemical formula 3)

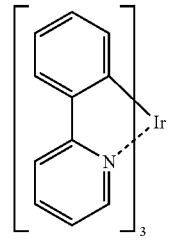

As described above, if phosphorescence from a triplet exciton can be put to practical use, it can realize the external light emitting quantum efficiency three to four times as high as that in the case of using fluorescence from a singlet exciton in principle.

Embodiment 7

A display device using a light emitting element is self-luminous and therefore is superior in visibility in bright surroundings compared to liquid crystal display devices and has wider viewing angle. Accordingly, it can be used for display portions of various electric equipments.

Given as embodiments of electric equipment employing a light emitting device formed by the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device equipped with a recording medium (specifically, a device equipped with a display device which can reproduce a recording medium such as a digital versatile disk (DVD), and can display the image). The light emitting device having a light emitting element is desirable particularly for a portable information terminal since its screen is often viewed obliquely and is required to have a wide viewing angle. Specific examples of the electric equipment are shown in FIGS. 14A to 14H.

Figure 14A:
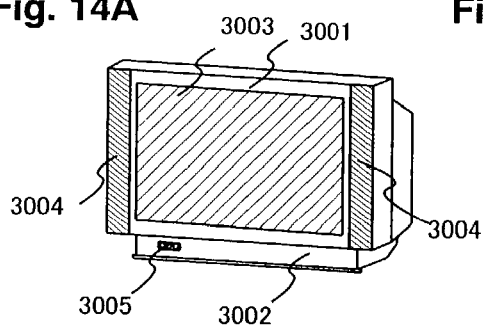
FIGS. 14A to 14H are views showing examples of electronic devices able to apply the present invention thereto.

FIG. 14A shows a display equipment, which comprises a casing 3001, a supporting base 3002, a display portion 3003, speaker portions 3004, a video input terminal 3005, etc. The light emitting device formed by the present invention is applied can be used for the display portion 3003. The light emitting device is self-luminous and does not need a backlight, so that it can make a thinner display portion than liquid crystal display devices can. The term display device includes every display device for displaying information such as one for a personal computer, one for receiving TV broadcasting, and one for advertisement.

Figure 14B:
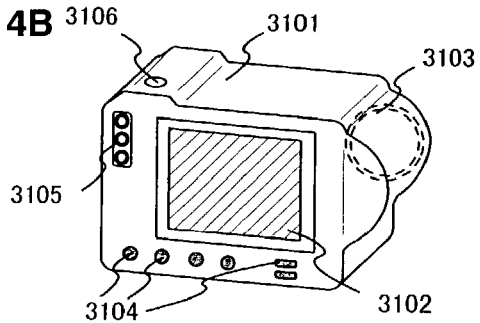

FIG. 14B shows a digital still camera, which comprises a main body 3101, a display portion 3102, an image receiving portion 3103, operation keys 3104, an external connection port 3105, a shutter 3106, etc. The light emitting device formed by the present invention is applied can be used for the display portion 3102.

Figure 14C:
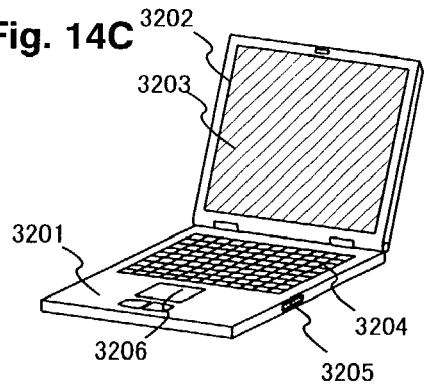

FIG. 14C shows a laptop computer, which comprises a main body 3201, a casing 3202, a display portion 3203, a keyboard 3204, an external connection port 3205, a pointing mouse 3206, etc. The light emitting device formed by the present invention is applied can be used for the display portion 3203.

Figure 14D:
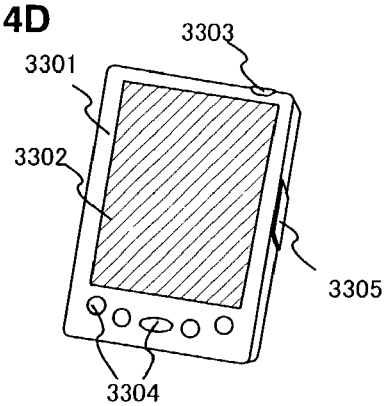

FIG. 14D shows a mobile computer, which comprises a main body 3301, a display portion 3302, a switch 3303, operation keys 3304, an infrared ray port 3305, etc. The light emitting device formed by the present invention is applied can be used for the display portion 3302.

Figure 14E:
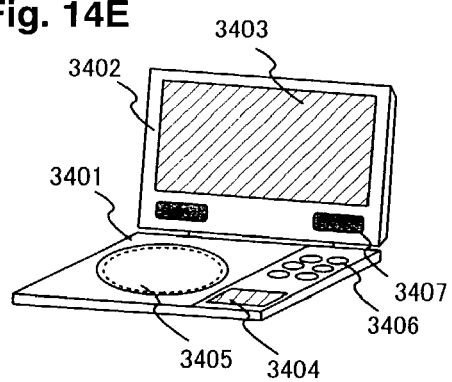

FIG. 14E shows a portable image reproducing equipment equipped with a recording medium (a DVD player, to be specific). The device comprises a main body 3401, a casing 3402, a display portion A 3403, a display portion B 3404, a recording medium (DVD or the like) reading portion 3405, operation keys 3406, speaker portions 3407, etc. The display portion A 3403 mainly displays image information whereas the display portion B 3404 mainly displays text information. The light emitting device formed by the present invention is applied can be used for the display portions A 3403 and B 3404. The term image reproducing device equipped with a recording medium includes domestic game machines.

Figure 14F:
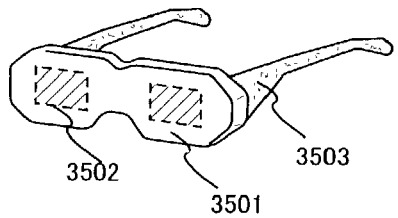

FIG. 14F shows a goggle type display (head mounted display), which comprises a main body 3501, display portions 3502, and arm portions 3503. The light emitting device formed by the present invention is applied can be used for the display portions 3502.

Figure 14G:
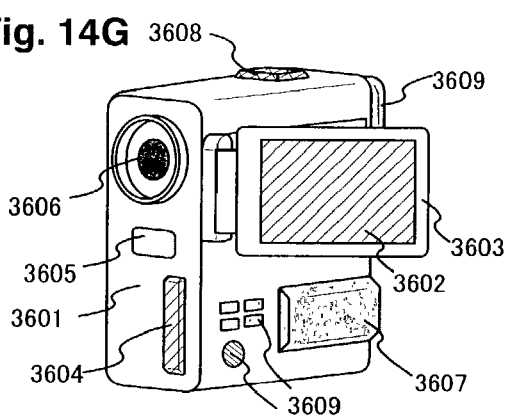

FIG. 14G shows a video camera, which comprises a main body 3601, a display portion 3602, a casing 3603, an external connection port 3604, a remote control receiving portion 3605, an image receiving portion 3606, a battery 3607, an audio input portion 3608, operation keys 3609 etc. The light emitting device formed by the present invention is applied can be used for the display portion 3602.

Figure 14H:
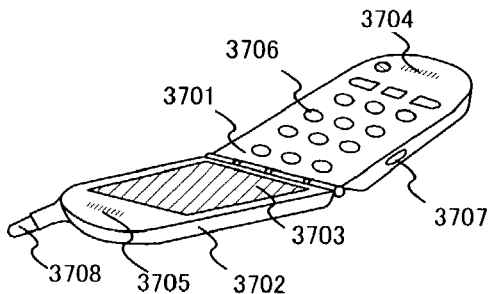

FIG. 14H shows a cellular phone, which comprises a main body 3701, a casing 3702, a display portion 3703, an audio input portion 3704, an audio output portion 3705, operation keys 3706, an external connection port 3707, an antenna 3708, etc. The light emitting device formed by the present invention is applied can be used for the display portion 3703. If the display portion 3703 displays white characters on a black background, power consumption of the cellular phone can be reduced.

If the luminance of light emitted from organic light emitting materials is increased in future, the light emitting device can be used also in a front type or rear type projector in which light bearing outputted image information is magnified by a lens or the like to be projected on a screen.

The electric equipment given in the above often displays information distributed through electronic communication lines such as Internet and CATV (cable television), especially, animation information with increasing frequency. The light emitting device having a light emitting element is suitable for displaying animation information since organic materials have fast response speed.

In the light emitting device, portions that emit light consume power. Therefore, it is desirable to display information such that as small portions as possible emits light. Accordingly, if the light emitting device is used for a display portion that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electric equipment of various field can employ the device. The electric equipments in this embodiment may use the light emitting device formed in Embodiments 1 to 6.

Further, the present embodiment is applicable to not only the display device using the OLED element but also the display device using other light emitting elements.

As mentioned above, in the present invention, the number of parts of the display device, the mounting area and electric power consumption can be reduced by building-in a power source circuit for supplying an electric current or a voltage to the OLED element on a substrate of the display device. Further, the present invention can be also applied to a display device using another light emitting element as well as the display device using the OLED element, and the above effects can be obtained.

What is claimed is:

1. A display device comprising:
   a plurality pixels;
   a plurality of source signal lines and a plurality of gate signal lines arranged in a matrix shape over a substrate;
   a plurality of light emitting elements in the plurality of pixels, each of the light emitting elements comprising at least one light emitting layer comprising an organic material; and
   a power source circuit comprising a thin film transistor over the substrate for applying at least one of an electric current and a voltage to at least one of the light emitting elements,
   wherein at least one of the plurality of pixels comprises a transistor, and
   wherein at least one of the plurality of source signal lines and at least one of one of the plurality of gate signal lines are connected to the transistor.

2. A display device comprising:
   a plurality of pixels;
   a plurality of source signal lines and a plurality of gate signal lines arranged in a matrix shape over a substrate;
   a plurality of light emitting elements in the plurality of pixels, each of the light emitting elements comprising at least one light emitting layer comprising an organic material for emitting light of a color selected from the group consisting of red, green and blue;
   a first power source circuit comprising a thin film transistor over the substrate for applying at least one of an electric current and a voltage to at least one of the light emitting elements for emitting red light;
   a second power source circuit comprising a thin film transistor over the substrate for applying at least one of an electric current and a voltage to at least one of the light emitting elements for emitting green light; and
   a third power source circuit comprising a thin film transistor over the substrate for applying at least one of an electric current and a voltage to at least one of the light emitting elements for emitting blue light,
   wherein at least one of the plurality of pixels comprises a transistor, and
   wherein at least one of the plurality of source signal lines and at least one of the plurality of gate signal lines are connected to the transistor.

3. A display device comprising;
   a plurality of pixels;
   a plurality of source signal lines and a plurality of gate signal lines arranged in a matrix shape over a substrate;

a plurality of light emitting elements in the plurality of pixels, each of the light emitting elements comprising at least one light emitting layer comprising an organic material; and a power source circuit using an operational amplifier comprising a thin film transistor over the substrate for applying at least one of an electric current and a voltage to at least one of the light emitting elements, wherein at least one of the plurality of pixels comprises a transistor, and wherein at least one of the plurality of source signal lines and at least one of the plurality of gate signal lines are connected to the transistor.

4. A display device comprising:

a plurality of pixels;

a plurality of source signal lines and a plurality of gate signal lines arranged in a matrix shape over a substrate;

a plurality of light emitting elements in the plurality of pixels, each of the light emitting elements comprising at least one light emitting layer comprising an organic material for emitting a color selected from the group consisting of red, green and blue;

a first power source circuit using an operational amplifier comprising a thin film transistor over the substrate for applying at least one of an electric current and a voltage to at least one of the light emitting elements for emitting red color;

a second power source circuit using an operational amplifier comprising a thin film transistor over the substrate for applying at least one of an electric current and a voltage to at least one of the light emitting elements for emitting green color; and a third power source circuit using an operational amplifier comprising a thin film transistor over the substrate for applying at least one of an electric current and a voltage to at least one of the light emitting elements for emitting blue color, wherein at least one of the plurality of pixels comprises a transistor, and wherein at least one of the plurality of source signal lines and at least one of the plurality of gate signal lines are connected to the transistor.

5. A display device according to claim 1, wherein a cathode is set to be common in the light emitting elements, and the output of the power source circuit is constructed from a source around p-channel transistor.

6. A display device according to claim 2, wherein a cathode is set to be common in the light emitting elements, and each of the output of the power source circuits is constructed from a source group p-channel transistor.

7. A display device according to claim 3, wherein a cathode is set to be common in the light emitting elements, and the output of the power source circuit is constructed from a source around p-channel transistor.

8. A display device according to claim 4, wherein a cathode is set to be common in the light emitting elements, and each of the output of the power source circuits is constructed from a source ground p-channel transistor.

9. A display device according to claim 1, wherein an anode is set to be common in the light emitting elements, and the output of the power source circuit is constructed from a source ground n-channel transistor.

10. A display device according to claim 2, wherein an anode is set to be common in the light emitting elements, and each of the outputs of the power source circuits are constructed front a source ground n-channel transistor.

11. A display device according to claim 3, wherein an anode is set to be common in the light emitting elements, and the output of the power source circuit is constructed from a source ground n-channel transistor.

12. A display device according to claim 4, wherein an anode is set to be common in the light emitting elements, and each of the outputs of the power source circuits are constructed from a source ground n-channel transistor.

13. A display device according to claim 5, wherein the power source circuit is set such that the difference between a highest electric potential within the power source circuit and an output electric potential is a threshold voltage of the p-channel transistor of the output or less.

14. A display device according to claim 6, wherein the power source circuits are set such that each of the differences between a highest electric potential within each of the power source circuits and each of output of electric potentials is a threshold voltage of each of the p-channel transistors of the outputs or less.

15. A display device according to claim 7, wherein the power source circuit is set such that the difference between a highest electric potential within the power source circuit and an output electric potential is a threshold voltage of the p-channel transistor of the output or less.

16. A display device according to claim 8, wherein the power source circuits are set such that each of the differences between a highest electric potential within each of the power source circuits and each of output electric potentials is a threshold voltage of each of the p-channel transistors of the outputs or less.

17. A display device according to claim 9, wherein the power source circuit is set such that the difference between a lowest electric potential within the power source circuit and an output electric potential is a threshold voltage of the n-channel transistor of the output or less.

18. A display device according to claim 10, wherein the power source circuits are set such that each of the differences between a lowest electric potential within each of the power source circuits and each of output electric potentials is a threshold voltage of the n-channel transistor of each of the outputs or less.

19. A display device according to claim 11, wherein the power source circuit is set such that the difference between a lowest electric potential within the power source circuit and an output electric potential is a threshold voltage of the n-channel transistor of the output or less.

20. A display device according to claim 12, wherein the power source circuits are set such that each of the differences between a lowest electric potential within each of the power source circuits and each of output electric potentials is a threshold voltage of the n-channel transistor of each of the outputs or less.

21. A display device comprising:

a plurality of pixels;

a plurality of source signal lines and a plurality of gate signal lines arranged in a matrix shape over a substrate;

a plurality of light emitting elements in the plurality of pixels, each of the light emitting elements comprising at least one light emitting layer comprising an organic material for emitting light of a color selected from the group consisting of red, green and blue;

a first power source circuit comprising a thin film transistor over the substrate for applying at least one of an electric current and a voltage to at least one of the light emitting elements for emitting light of a color selected from the group consisting of red, green and blue, and a second power source circuit comprising a thin film transistor over the substrate for applying at least one of an electric current and a voltage to at least one of the light emitting elements for emitting light of a color selected from the group consisting of red, green and blue, wherein the second power source circuit is applied to at least one of the of the light emitting elements for emitting light of a color other than that of the first power source circuit, wherein at least one of the plurality of pixels comprises a transistor, and wherein at least one of the plurality of source signal lines and at least one of the plurality of gate signal lines are connected to the transistor.

22. A display device comprising;

a plurality of pixels;

a plurality of source signal lines and a plurality of gate signal lines arranged in a matrix shape over a substrate;

a plurality of light emitting elements in the plurality of pixels, each of the light emitting elements comprising at least one light emitting layer comprising an organic material for emitting light of a color selected from the group consisting of red, green and blue;

a first power source circuit using an operational amplifier comprising a thin film transistor over the substrate for applying at least one of an electric current and a voltage to at least one of the light emitting elements for emitting light of a color selected front the group consisting of red, green and blue; and a second power source circuit an operational amplifier comprising a thin film transistor over the substrate for applying at least one of an electric current and a voltage to at least one of the light emitting elements for emitting light of a color selected front the group consisting of red, green and blue, wherein the second power source circuit is applied to at least one of the light emitting elements for emitting light of a color other than that of the first power source circuit, wherein at least one of the plurality of pixels comprises a transistor, and wherein at least one of the plurality or source signal lines and at least one of the plurality of gate signal lines are connected to the transistor.

23. A display device comprising:

a plurality of pixels;

a plurality of source signal lines and a plurality of gate signal lines arranged in a matrix shape over a substrate;

a plurality of light emitting elements in the plurality of pixels, each of the light emitting elements comprising at least one light emitting layer comprising an organic material for emitting light of a color selected from the group consisting of red, green and blue; and a power source circuit comprising a thin film transistor over the substrate for applying at least one of an electric current and a voltage to at least one of the light emitting elements for emitting light of a color selected from the group consisting of red, green and blue, wherein at least one of the plurality of pixels comprises a transistor, and wherein at least one of the plurality of source signal lines and at least one of the plurality of gate signal lines are connected to the transistor.

24. A display device comprising:

a plurality of pixels;

a plurality of source signal lines and a plurality of gate signal lines arranged in a matrix shape over a substrate;

a plurality of light emitting elements in the plurality of pixels, each of the light emitting elements comprising at least one light emitting layer comprising an organic material for emitting light of a color selected from the group consisting of red, green and blue; and a power source circuit using an operational amplifier comprising a thin film transistor over the substrate for applying at least one of an electric current and a voltage to at least one of the light emitting elements for emitting light of a color selected from the group consisting of red, green and blue wherein at least one of the plurality of pixels comprises a transistor, and wherein at least one of the plurality of source signal lines and at least one of the plurality of gate signal lines are connected to the transistor.

25. A display device according to claim 21, wherein a cathode is set to be common in the light emitting elements, and each of the output of the power source circuits is constructed from a source ground p-channel transistor.

26. A display device according to claim 22, wherein a cathode is set to be common in the light emitting elements, and each of the output of the power source circuits is constructed from a source ground p-channel transistor.

27. A display device according to claim 23, wherein a cathode is set to be common in the light emitting elements, and the output of the power source circuit is constructed from, a source around p-channel transistor.

28. A display device according to claim 24, wherein a cathode is set to be common in the light emitting elements, and the output of the power source circuit is constructed from a source ground p-channel transistor.

29. A display device according to claim 21, wherein an anode is set to be common in the light emitting elements, and each of the output of the power source circuits is constructed from a source around n-channel transistor.

30. A display device according to claim 22, wherein an anode is set to be common in the light emitting elements, and each of the output of the power source circuits is constructed from a source ground n-channel transistor.

31. A display device according to claim 23, wherein an anode is set to be common in the light emitting elements, and the output of the power source circuit is constructed from a source ground n-channel transistor.

32. A display device according to claim 24, wherein an anode is set to be common in the light emitting elements, and the output of the power source circuit is constructed from a source ground n-channel transistor.

33. A display device according to claim 25, wherein the power source circuits are set such that each of the differences between a highest electric potential within each of the power source circuits and each of output electric potentials is a threshold voltage of each of the p-channel transistors of the outputs or less.

34. A display device according to claim 26, wherein the power source circuits are set such that each of the differences between a highest electric potential within each of the power source circuits and each of output electric potentials is a threshold voltage of each of the p-channel transistors of the outputs or less.

35. A display device according to claim 27, wherein the power source circuit is set such that the difference between a highest electric potential within the power source circuit and an output electric potential is a threshold voltage of the p-channel transistor of the output or less.

36. A display device according to claim 28, wherein the power source circuit is set such that the difference between a highest electric potential within the power source circuit and an output electric potential is a threshold voltage of the p-channel transistor of the output or less.

37. A display device according to claim 29, wherein the power source circuits are set such that each of the differences between a lowest electric potential each of the power source circuits and each of output electric potentials is a threshold voltage of the n-channel transistor of each of the outputs or less.

38. A display device according to claim 30, wherein the power source circuits are set such that each of the differences between a lowest electric potential within each of the power source circuits and each of output electric potentials is a threshold voltage of the n-channel transistor of each of the outputs or less.

39. A display device according to claim 31, wherein the power source circuit is set such that the difference between a lowest electric potential within the power source circuit and an output electric potential is a threshold voltage of the n-channel transistor of the output or less.

40. A display device according to claim 32, wherein the power source circuit is set such that the difference between a lowest electric potential within the power source circuit and an output electric potential is a threshold voltage of the n-channel transistor of the output or less.

41. A display device according to claim 3, wherein the operational amplifier comprises a differential circuit and a current mirror circuit.

42. A display device according to claim 4, wherein each of the operational amplifiers comprises a differential circuit and a current mirror circuit.

43. A display device according to claim 22, wherein each of the operational amplifiers comprises a differential circuit and a current mirror circuit.

44. A display device according to claim 24, wherein the operational amplifier comprises a differential circuit and a current mirror circuit.

45. An electric equipment comprising a display device according to claim 1, wherein the electric equipment is one selected from the group consisting of a display equipment, a digital still camera, a laptop computer, a mobile computer, a portable image reproducing equipment, a goggle type display, a video camera and a cellular phone.

46. An electric equipment comprising a display device according to claim 2, wherein the electric equipment is one selected from the group consisting of a display equipment, a digital still camera, a laptop computer, a mobile computer, a portable image reproducing equipment, a goggle type display, a video camera arid a cellular phone.

47. An electric equipment comprising a display device according to claim 3, wherein the electric equipment is one selected from the group consisting of a display equipment, a digital still camera, a laptop computer, a mobile computer, a portable image reproducing equipment, a goggle type display, a video camera and a cellular phone.

48. An electric equipment comprising a display device according to claim 4, wherein the electric equipment is one selected from the group consisting of a display equipment, a digital still camera, a laptop computer, a mobile computer, a portable image reproducing equipment, a goggle type display, a video camera and a cellular phone.

49. An electric equipment comprising a display device according to claim 21, wherein the electric equipment is one selected from the group consisting of a display equipment, a digital still camera, a laptop computer, a mobile computer, a portable image reproducing equipment, a goggle type display, a video camera and a cellular phone.

50. An electric equipment comprising a display device according to claim 22, wherein the electric equipment is one selected worn the group consisting of a display equipment, a digital still camera, a laptop computer, a mobile computer, a portable image reproducing equipment, a goggle type display, a video camera and a cellular phone.

51. An electric, equipment comprising a display device according to claim 23, wherein the electric equipment is one selected from the group consisting of a display equipment, a digital camera, a laptop computer, a mobile computer, a portable image reproducing equipment, a goggle type display, a video camera and a cellular phone.

52. An electric equipment comprising a display device according to claim 24, wherein the electric equipment is one selected from the group consisting of a display equipment, a digital still camera, a laptop computer, a mobile computer, a portable image reproducing equipment, a goggle type display, a video camera and a cellular phone.

* * * * *

UNITED STATES PATENT AND TRADEMARK OFFICE
CERTIFICATE OF CORRECTION

| | | |
|---|---|---|
| PATENT NO. | : 7,737,924 B2 | Page 1 of 1 |
| APPLICATION NO. | : 10/313778 | |
| DATED | : June 15, 2010 | |
| INVENTOR(S) | : Jun Koyama | |

It is certified that error appears in the above-identified patent and that said Letters Patent is hereby corrected as shown below:

Column 26, line 36, in claim 1 delete "one of" from "and at least one of one of";

Column 27, line 67, in claim 10 replace "front" with --from--;

Column 28, line 17, in claim 14 after "output" delete "of";

Column 29, line 7, in claim 21 delete "the of" from "at least one of the of";

Column 29, line 28, in claim 22 replace "front" with --from--;

Column 29, line 34, in claim 22 replace "front" with --from--;

Column 32, line 6, in claim 46 replace "arid" with --and--;

Column 32, line 27, in claim 50 replace "worn" with --from--.

Signed and Sealed this
Thirteenth Day of September, 2011

David J. Kappos
*Director of the United States Patent and Trademark Office*